United States Patent
Hamano

(10) Patent No.: US 10,703,597 B2
(45) Date of Patent: Jul. 7, 2020

(54) RECORDING DEVICE AND CONTROL METHOD FOR RECORDING DEVICE

(71) Applicant: SEIKO EPSON CORPORATION, Tokyo (JP)

(72) Inventor: Ryo Hamano, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/230,054

(22) Filed: Dec. 21, 2018

(65) Prior Publication Data

US 2019/0193975 A1 Jun. 27, 2019

(30) Foreign Application Priority Data

Dec. 22, 2017 (JP) .................. 2017-245962

(51) Int. Cl.
*B65H 20/00* (2006.01)
*B65H 20/02* (2006.01)
(Continued)

(52) U.S. Cl.
CPC .......... *B65H 20/005* (2013.01); *B41J 11/425* (2013.01); *B65H 20/02* (2013.01); *B65H 23/18* (2013.01); *B65H 23/182* (2013.01); *B65H 23/185* (2013.01); *B65H 23/1825* (2013.01); *B65H 23/1888* (2013.01); *B65H 23/192* (2013.01); *G01R 19/0092* (2013.01); *B65H 2403/92* (2013.01); *B65H 2513/11* (2013.01); *B65H 2515/32* (2013.01); *B65H 2553/51* (2013.01); *B65H 2557/20* (2013.01); *B65H 2801/36* (2013.01)

(58) Field of Classification Search
CPC .... B65H 20/005; B65H 23/182; B65H 23/18; B65H 20/02; B65H 2557/20; B65H 2403/92; B65H 23/192; B65H 23/1888; B65H 23/185; B65H 23/1825; B65H 2801/36; B65H 2515/32; B65H 2513/11; B65H 2553/51; B41J 11/425; G01R 19/0092

See application file for complete search history.

(56) References Cited

U.S. PATENT DOCUMENTS

2003/0184002 A1\* 10/2003 Akiyama ............. B65H 3/0669
271/110
2015/0329310 A1 11/2015 Hayashi

FOREIGN PATENT DOCUMENTS

JP 2015-231910 A 12/2015

\* cited by examiner

*Primary Examiner* — Justin Seo
(74) *Attorney, Agent, or Firm* — Foley & Lardner LLP

(57) ABSTRACT

A recording device includes: a transport unit configured to transport a medium in a plurality of transport speed modes; a driving unit configured to drive the transport unit with a plurality of speed profiles, each corresponding to one of the plurality of transport speed modes; a current sensor configured to measure a reference current the driving unit, the reference current being a current flowing in the driving unit when the medium is transported in a loosened state; and a control configured to acquire a plurality of current profiles, each corresponding to one of the speed profiles, based on the reference current. The control unit is configured to acquire a first current profile based on the reference current when the medium is transported in a first transport speed mode, and to generate a second current profile based on the first current profile.

5 Claims, 12 Drawing Sheets

(51) Int. Cl.
*G01R 19/00* (2006.01)
*B41J 11/42* (2006.01)
*B65H 23/18* (2006.01)
*B65H 23/182* (2006.01)
*B65H 23/192* (2006.01)
*B65H 23/188* (2006.01)
*B65H 23/185* (2006.01)

RECORDING DEVICE AND CONTROL METHOD FOR RECORDING DEVICE

CROSS-REFERENCE TO RELATED APPLICATION

This application claims priority under 35 U.S.C. § 119 to Japanese Patent Application No. 2017-245962, filed Dec. 22, 2017, the disclosure of which is hereby incorporated by reference in its entirety.

BACKGROUND

1. Technical Field

The invention relates to a recording device and a control method for a recording device.

2. Related Art

For example, a medium transport device (recording device) configured to repeat an operation of discharging ink from a recording head to form a dot, and an operation of transporting a medium (transport operation), and configured to record an image on the medium pulled out of a roll paper (roll body) has been proposed (e.g., JP-A-2015-231910). The recording device described in JP-A-2015-231910 includes a retention unit configured to retain a roll body formed with a medium wound, a transport unit configured to pull the medium out of the roll body and transport the medium, a roll motor configured to rotate the roll body via the retention unit in a direction in which the medium is transported from the roll body, and a PF motor configured to drive the transport unit, and based on a difference between a transport current flowing in the PF motor and a reference current flowing in the PF motor, the roll motor is driven and controlled to make tension applied on the medium during the transport operation difficult to vary.

In a case in which the medium is transported in a state where the medium is loosened, the reference current is a current flowing in the PF motor, and is a reference in performing drive control of the roll motor. In a case in which the medium is transported by the transport operation, the transport current is a current flowing in the PF motor. Then, based on a measurement result of the reference current acquired at this time, an operation of discharging ink from a recording head to form a dot (ink discharge operation) is performed.

As described above, a purpose of the reference current measurement is to perform the reference current measurement in a stage before the operation of discharging ink from the recording head to form a dot (ink discharge operation) is performed and thus, to acquire parameters necessary for the ink discharge operation in advance. That is, a duration in which the reference current measurement is performed is waiting time in which no ink discharge operation is performed. In this case, in a case in which the recording device includes a plurality of transport speed profiles, it has been necessary to measure the reference current for each transport speed mode before performing the ink discharge operation. Therefore, each time the transport speed mode is changed, the reference current measurement operation becomes necessary, and it takes time before starting the ink discharge operation and thus, a throughput has tended to lower.

SUMMARY

The embodiments described in the present disclosure have been made to address at least some of the above-described issues and can be realized as the following modes or application examples.

First Application Example

A recording device according to an application example includes a transport unit configured to transport a medium in a plurality of transport speed modes, a driving unit configured to drive the transport unit with a plurality of speed profiles, each corresponding to one of the plurality of transport speed modes, a current sensor configured to measure a reference current driving unit, the reference current being a current flowing in the driving unit when the medium is transported in a loosened state, and a control configured to acquire a plurality of current profiles, each corresponding to one of the speed profiles, based on the reference current, and in the recording device, the plurality of transport speed modes includes a first transport speed mode, and a second transport speed mode in which a transport speed of the medium is slower than that in the first transport speed mode, the plurality of speed profiles includes a first speed profile corresponding to the first transport speed mode and a second speed profile corresponding to the second transport speed mode, the plurality of current profiles includes a first current profile corresponding to the first speed profile and a second current profile corresponding to the second speed profile, each of the speed profiles includes an acceleration region in which the transport speed increases over time, and the control unit is configured to acquire the first current profile from the reference current when the medium is transported in the first transport speed mode, and is further configured to use the first current profile until a predetermined time in the acceleration region, and to generate the second current profile in the acceleration region.

The first current profile is acquired by loosening the medium, transporting the loosened medium in the first transport speed mode, and actually measuring a reference current flowing in the driving unit at that time. On the other hand, the second current profile in the acceleration region is not acquired by transporting the loosened medium in the second transport speed mode, and actually measuring a reference current flowing in the driving unit at that time, but is generated by using the first current profile until a predetermined time in the acceleration region. That is, in a case in which the second current profile in the acceleration region is acquired, the actual measurement of the reference current flowing in the driving unit is omitted, and thus time for acquiring the second current profile in the acceleration region can be shortened, as compared to a case where the reference current flowing in the driving unit is actually measured.

When the time for acquiring the second current profile in the acceleration region is shortened, waiting time (downtime) of the recording device can be reduced. Therefore, productivity of the recording device can be enhanced.

Second Application Example

In the recording device described in the above-described application example, the speed profile preferably includes a constant speed region in which the transport speed is constant over time, and the control unit is preferably configured to use the first current profile in the constant speed region to generate the second current profile in the constant speed region.

The second current profile in the constant speed region is not acquired by transporting the loosened medium, and actually measuring a reference current flowing in the driving unit at that time, but is generated by using the first current profile in the constant speed region. That is, in a case in which the second current profile in the constant speed region is acquired, the actual measurement of the reference current flowing in the driving unit is omitted, and thus time for acquiring the second current profile in the constant speed region can be shortened, as compared to a case where the reference current flowing in the driving unit is actually measured.

When the time for acquiring the second current profile in the constant speed region is shortened, waiting time (downtime) of the recording device can be reduced. Therefore, productivity of the recording device can be enhanced.

Third Application Example

In the recording device described in the above-described application example, the current sensor is configured to measure the reference current discretely.

When the reference current is measured discretely, a duration in which the reference current is measured can be shortened, as compared to a case where the reference current is measured continuously. Further, when the reference current is measured discretely to acquire a current profile, a duration in which the current profile is acquired can be shortened, as compared to a case where the reference current is measured continuously to acquire the current profile.

Fourth Application Example

A control method for a recording device according to the application example is a control method for a recording device including a transport unit configured to transport a medium in a plurality of transport speed modes, a driving unit configured to drive the transport unit with a plurality of speed profiles, each corresponding to one of the plurality of transport speed modes, a current sensor configured to measure a reference current flowing in the driving unit, the reference current being a current flowing in the driving unit when the medium is transported in a loosened state, and a control unit configured to acquire a plurality of current profiles, each corresponding to one of the speed profiles, based on the reference current, wherein the plurality of transport speed modes includes a first transport speed mode, and a second transport speed mode in which a transport speed of the medium is slower than that in the first transport speed mode, the plurality of speed profiles includes a first speed profile corresponding to the first transport speed mode and a second speed profile corresponding to the second transport speed mode, the plurality of current profiles includes a first current profile corresponding to the first speed profile and a second current profile corresponding to the second speed profile. And in the control method, by using the control unit, the first current profile is acquired based on the reference current when the medium is transported in the first transport speed mode, and by using the control unit, the second current profile is generated based on the first current profile.

In a process in which the first current profile is acquired, the reference current is actually measured to acquire the first current profile. In a process in which the second current profile is acquired, the reference current is not actually measured to acquire the second current profile, but the second current profile is generated from the first current profile to acquire the second current profile. That is, in the process in which the second current profile is acquired, the reference current need not actually be measured, and thus the time for acquiring the second current profile can be shortened, as compared to a case where the reference current is actually measured.

When the time for acquiring the second current profile is shortened, waiting time (downtime) of the recording device can be reduced. Therefore, productivity of the recording device can be enhanced.

BRIEF DESCRIPTION OF THE DRAWINGS

The invention will be described with reference to the accompanying drawings, wherein like numbers reference like elements.

DESCRIPTION OF EXEMPLARY EMBODIMENTS

An exemplary embodiment of the invention is described below with reference to the accompanying drawings. The exemplary embodiment is merely illustrative, and the invention is not limited to the exemplary embodiment. The exemplary embodiment can be modified as desired without departing from the scope of the technical concept of the invention. Additionally, in each of the following drawings, to make each layer, each member, and the like recognizable in terms of size, each of the layers, members, and the like is illustrated in a scale different from an actual scale.

Exemplary Embodiment

Overview of Recording Device

Figure 1:
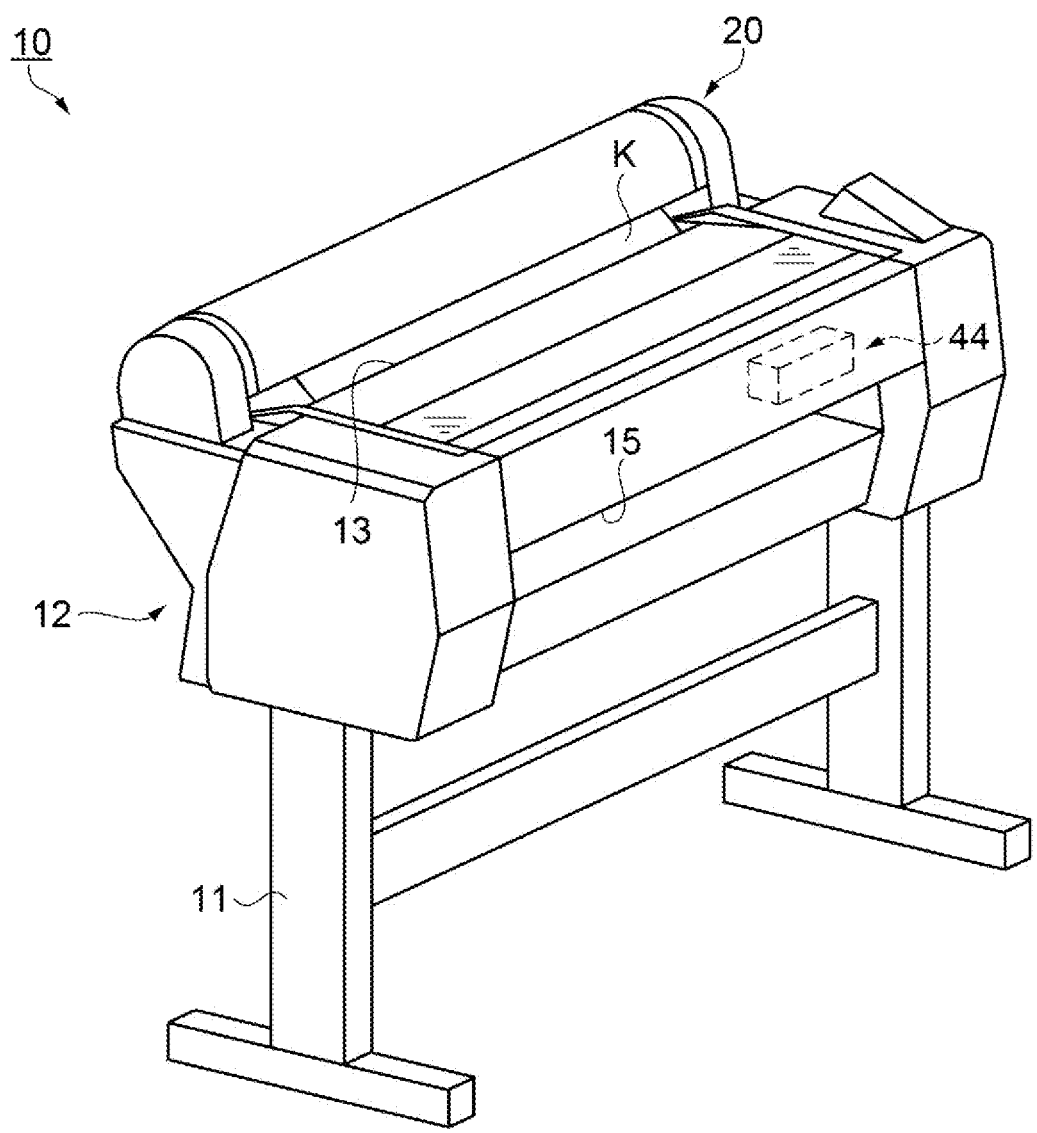
FIG. 1 is a perspective view of a recording device according to an exemplary embodiment.
Figure 2:
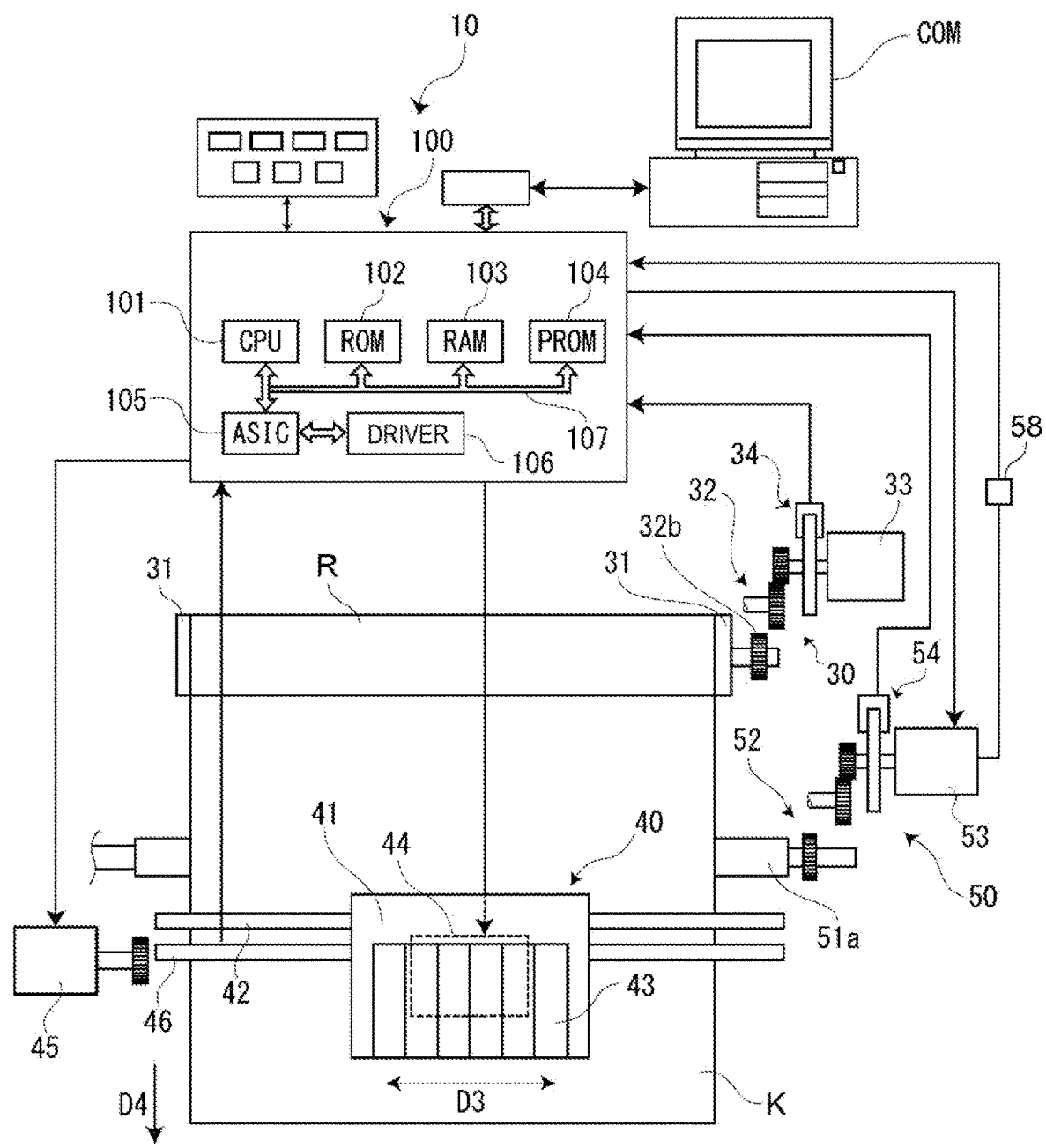
FIG. 2 is a schematic view illustrating a schematic configuration of the recording device according to the exemplary embodiment.

FIG. 1 is a perspective view of a recording device according to an exemplary embodiment. FIG. 2 is a schematic view illustrating a schematic configuration of the recording device according to the exemplary embodiment.

Figure 3:
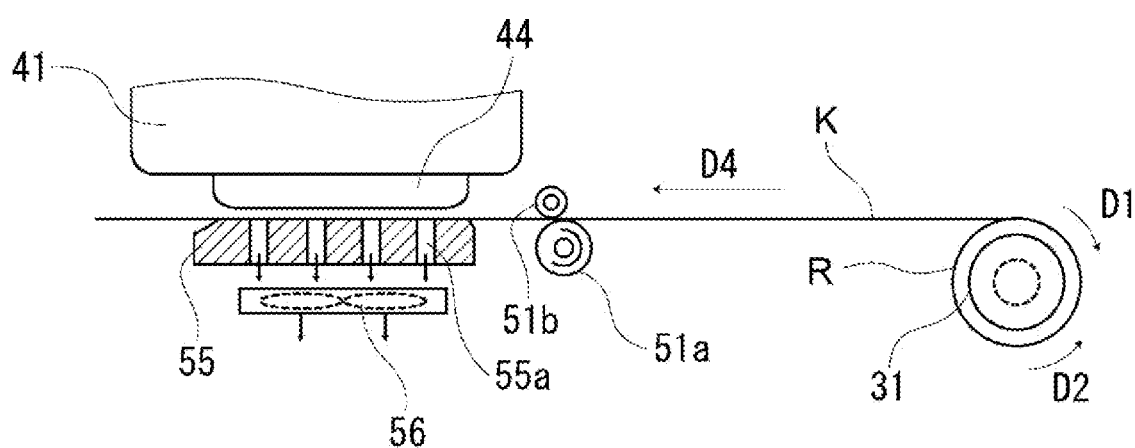
FIG. 3 is a schematic view illustrating a state of a case where an image is recorded on a medium.
Figure 4:
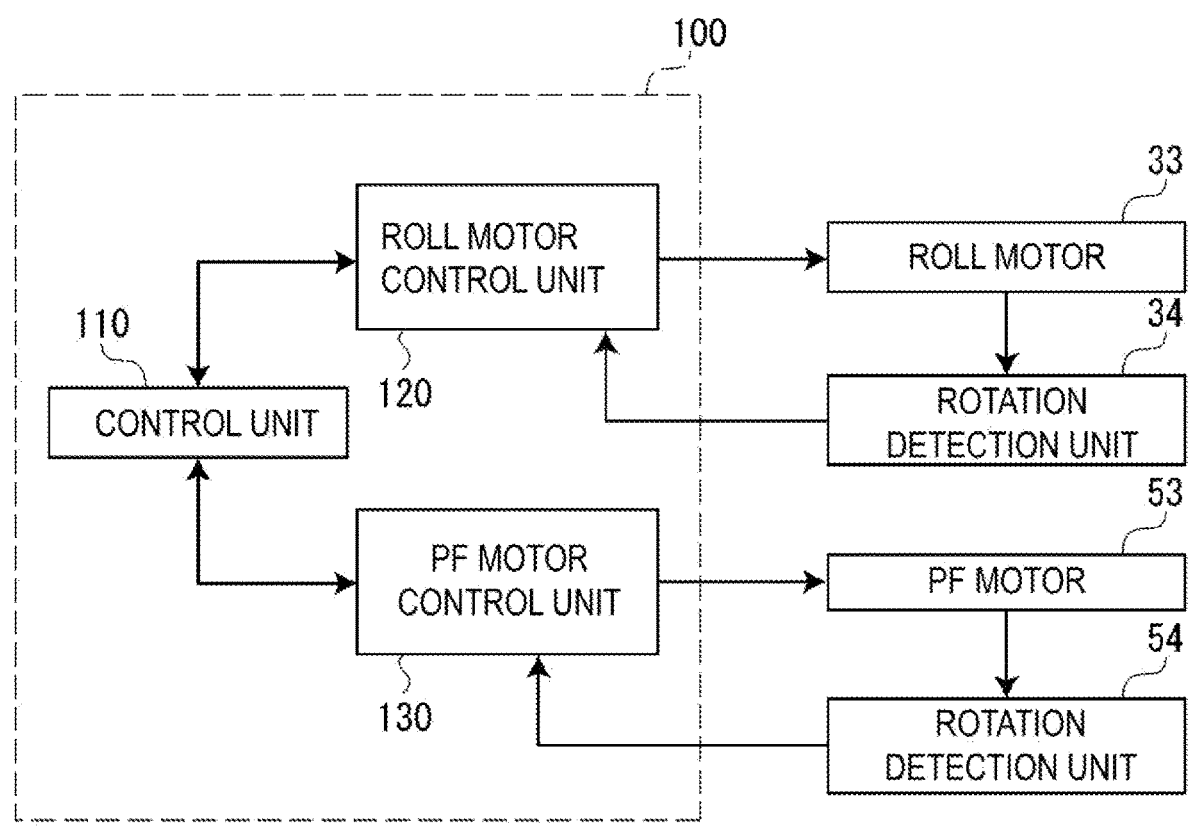
FIG. 4 is a block diagram illustrating a functional configuration example of a controller.
Figure 5:
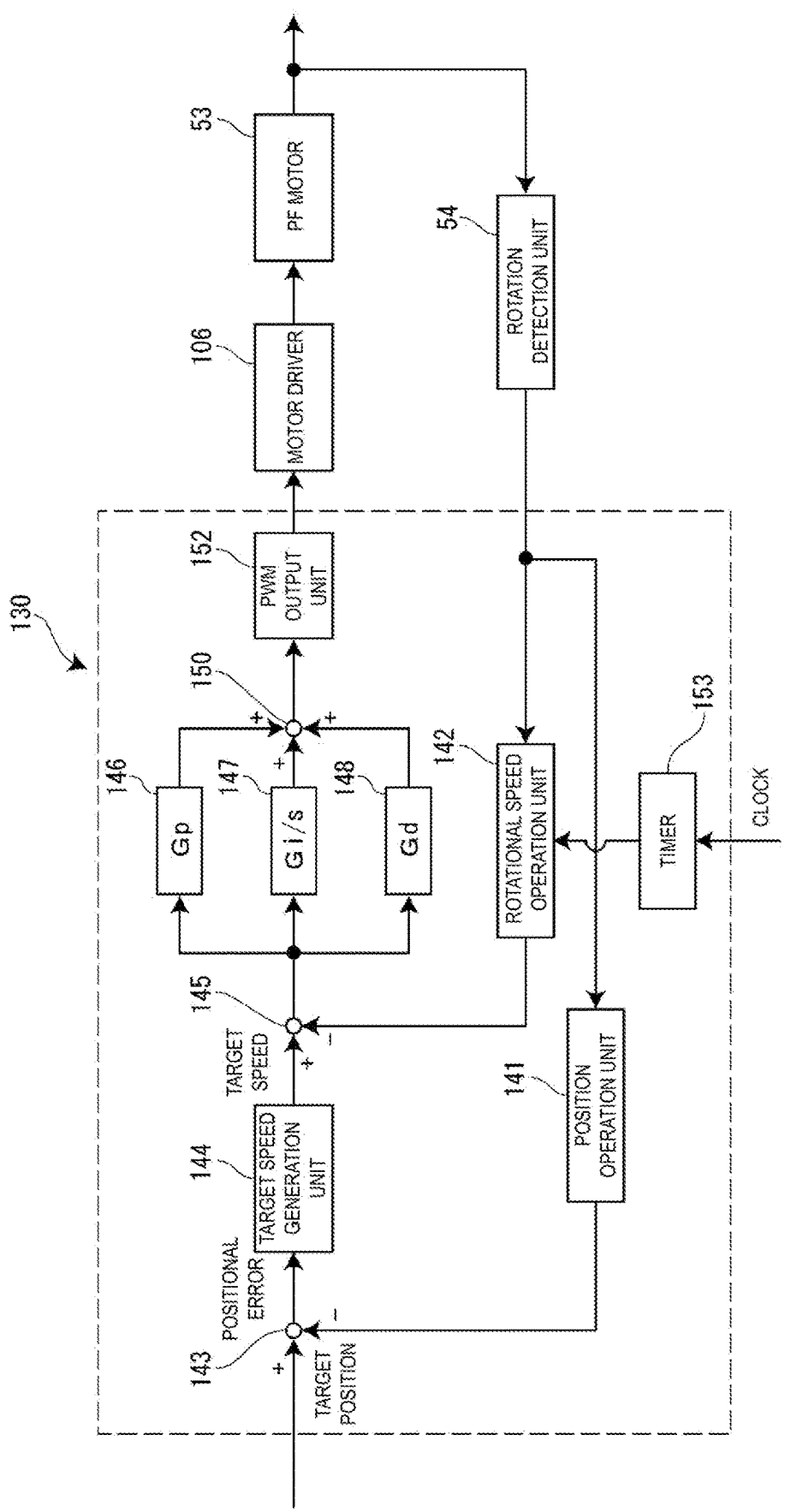
FIG. 5 is a block diagram illustrating a functional configuration example of a PF motor control unit.

FIG. 3 is a schematic view illustrating a state of a case where an image is recorded on a medium. FIG. 4 is a block diagram illustrating a functional configuration example of a controller. FIG. 5 is a block diagram illustrating a functional configuration example of a PF motor control unit. Specifically, FIG. 5 is a block diagram of a PF motor control unit 130 in the case of performing PID control.

First of all, an overview of a recording device 10 according to the exemplary embodiment is described with reference to FIG. 1 to FIG. 5.

As illustrated in FIG. 1, the recording device 10 according to the exemplary embodiment is a large format printer (LFP) configured to handle a medium K elongated. The recording device 10 includes a pair of legs 11, a housing unit 12 having a substantially rectangular parallelepiped shape and supported by the legs 11, and a set unit 20 configured to deliver the medium K to the housing unit 12.

The set unit 20 accommodates a roll body R (see FIG. 2) formed with the medium K wound in a cylindrical shape (roll shape), and a roll driving mechanism 30 (see FIG. 2) configured to drive the roll body R. The roll body R is rotationally driven by a roll motor 33 (see FIG. 2) to deliver the medium K from the roll body R, and the medium K is supplied to a recording head 44 inside the housing unit 12.

The medium K is an example of a "medium," and made of, for example, fiber such as polyester, paper, and a film.

Note that the roll body R multi-sized and formed with the medium K having a different width and the different number of times of winding is replaceably loaded to the set unit 20. The roll body R is loaded to the set unit 20 in a state where the roll body R is pushed to a right end side in FIG. 1, regardless of the size of the roll body R. That is, in the recording device 10, a reference position for alignment of the medium K is set on the right end side in FIG. 1.

The housing unit 12 includes a feeding port 13, a discharging port 15, and the like. The feeding port 13 is provided on an upper portion of a back side of the housing unit 12. The medium K delivered from the roll body R contained in the set unit 20 is fed inside the housing unit 12 from the feeding port 13. The discharging port 15 is provided on a front side of the housing unit 12. The medium K on which an image is recorded (printed) inside the housing unit 12 is discharged outside the housing unit 12 from the discharging port 15.

As illustrated in FIG. 2, the recording device 10 is communicatively connected with a computer COM being an external device. The recording device 10 receives image data for recording an image from the computer COM. Note that the recording device 10 is not limited to the configuration in which the image data is received from the computer COM, and, for example, may receive image data from a storage medium such as a Universal Serial Bus (USB) memory, and the recording device 10 itself may create image data.

The recording device 10 includes a controller 100, the roll driving mechanism 30, a recording unit 40, a transport mechanism 50, and a platen 55 (see FIG. 3).

The controller 100 includes a Central Processing Unit (CPU) 101, a Read Only Memory (ROM) 102, a Random Access Memory (RAM) 103, a Programmable ROM (PROM) 104, an Application Specific Integrated Circuit (ASIC) 105, a motor driver 106, and a bus 107, and controls each unit of the recording device 10.

The roll driving mechanism 30 includes a pair of rotation holders 31 configured to support the roll body R, a roll train wheel 32, a roll motor 33 configured to rotationally drive the roll body R, and a rotation detection unit 34 configured to detect a rotation position of the roll body R.

The pair of rotation holders 31 is individually inserted on both sides of a core of the roll body R, and supports the roll body R from the both sides. The pair of rotation holders 31 is rotatably supported by a holder supporting unit (not illustrated). One rotation holder 31 is provided with a roll input gear 32$b$ configured to engage with a roll output gear (not illustrated) of the roll train wheel 32.

The roll motor 33 gives torque to the one rotation holder 31. The roll motor 33 is, for example, a Direct Current (DC) motor. The torque from the roll motor 33 is transmitted via the roll train wheel 32 to rotate the rotation holder 31, and the roll body R held by the rotation holder 31.

The roll motor 33 can rotate the roll body R in a delivery rotation direction D2 (see FIG. 3) to unwind (deliver) the medium K from the roll body R. Further, the roll motor 33 can rotate the roll body R in a rewinding rotation direction D1 (see FIG. 3) to rewind the medium K around the roll body R.

For example, when the roll motor 33 rotates the roll body R in the delivery rotation direction D2, the medium K is delivered from the roll body R toward a driving roller 51$a$. That is, the roll motor 33 drives the roll body R formed with the medium K wound, and delivers the medium K from the roll body R to the driving roller 51$a$ (transport unit).

The rotation detection unit 34 is a rotary encoder including a disk-shaped scale provided on an output shaft of the roll motor 33, and a photo interrupter. A rotation position and a rotation direction of the roll body R can be detected by the rotation detection unit 34.

The recording unit 40 includes a carriage 41, a carriage shaft 42, the recording head 44, a carriage motor 45, and a carriage position detection unit 46.

The carriage motor 45 drives a belt mechanism (not illustrated) to move the carriage 41 in a moving direction D3 (scan direction) along the carriage shaft 42. The carriage 41 is provided with an ink tank 43 configured to store ink of each color. The ink tank 43 is supplied with the ink via a tube from an ink cartridge (not illustrated).

The carriage position detection unit 46 is a linear encoder including a linear scale provided along the moving direction D3, and a photo interrupter. The carriage position detection unit 46 can detect a position of the carriage 41 in the moving direction D3.

The recording head 44 includes a plurality of nozzles (not illustrated), and is configured to be capable of discharging the ink. The recording head 44 is held in the carriage 41, and reciprocates in a width direction (moving direction D3) of the medium K with power of the carriage motor 45.

The transport mechanism 50 includes the driving roller 51$a$, a driven roller 51$b$, a delivery train wheel 52, a PF motor 53, a rotation detection unit 54, and a current sensor 58.

The current sensor 58 is an example of a "measurement method," and measures a current of the PF motor 53 (a transport current Ia, and a reference current Ib). Although details will be described later, the current sensor 58 measures the reference current Ib flowing in the PF motor 53 in a case in which the medium K is transported in a loosened state, and measures the transport current Ia flowing in the PF motor 53 in a case in which an image is actually recorded on the medium K. Further, the current sensor 58 discretely measures the reference current Ib. When the reference current Ib is measured discretely, a duration in which the reference current Ib is measured can be shortened, as compared to a case where the reference current Ib is measured continuously.

The PF motor 53 is an example of a "driving unit," gives torque to the driving roller 51a being an example of a "transport unit" and drives the driving roller 51a. The PF motor 53 is, for example, a DC motor. The torque from the PF motor 53 is transmitted to the driving roller 51a via the delivery train wheel 52. Although details will be described later, the PF motor 53 drives the driving roller 51a with a plurality of speed profiles corresponding to a plurality of transport speed modes, and the driving roller 51a transports the medium K in the plurality of transport speed modes.

The rotation detection unit 54 is a rotary encoder including a disk-shaped scale provided on an output shaft of the PF motor 53, and a photo interrupter. A rotation position and a rotation direction of the driving roller 51a can be detected by the rotation detection unit 54.

The driven roller 51b is pressed against the driving roller 51a via the medium K and is driven to rotate. The driving roller 51a pinches the medium K together with the driven roller 51b. That is, the PF motor 53 rotationally drives the driving roller 51a and thus, the driving roller 51a transports the medium K in a transport direction D4.

As illustrated in FIG. 3, the platen 55 is provided to face the recording head 44. A plurality of suction holes 55a passing through vertically is formed in the platen 55. Additionally, a suction fan 56 is provided below the platen 55. Actuation of the suction fan 56 makes pressure inside the suction hole 55a negative, and the medium K is supported on the platen 55 by suction. This prevents deterioration in recording quality due to lifting of the medium K.

In the recording device 10, when the roll body R rotates in the delivery rotation direction D2, the medium K is unwound from the roll body R and is delivered toward the transport mechanism 50 (driving roller 51a). Additionally, the medium K delivered from the roll body R is transported in the transport direction D4 to the recording unit 40 by the transport mechanism 50 (driving roller 51a).

Then, in the recording device 10, an operation in which the recording head 44 held in the carriage 41 discharges ink onto a surface of the medium K while the recording head 44 reciprocates in the width direction (moving direction D3) of the medium K, and an operation in which the transport mechanism 50 (driving roller 51a) transports the medium K in the transport direction D4 are alternately repeated to align a plurality of dot sequences (raster lines) in the transport direction D4, and thus a predetermined image is recorded on the medium K.

That is, the recording device 10 alternately repeats an operation of pulling the medium K out of the roll body R to the recording head 44 side and discharging ink on the surface of the medium K (hereinafter, referred to as the ink discharge operation), and an operation of transporting the medium K in the transport direction D4 (hereinafter, referred to as a transport operation), and an image is recorded on the medium K.

As illustrated in FIG. 4, the controller 100 includes a control unit 110, a roll motor control unit 120, and the PF motor control unit 130. Each of the above-described function units is realized by cooperation of hardware configuring the controller 100 and software stored in a memory such as the ROM 102.

The control unit 110 gives instructions to the motor control units 120 and 130, and controls the roll motor 33 and the PF motor 53. The control unit 110 can give instructions to the motor control units 120 and 130 to cause each of the roll motor 33 and the PF motor 53 to be independently driven, or to cause the roll motor 33 and the PF motor 53 to be synchronously driven.

As illustrated in FIG. 5, the PF motor control unit 130 includes a position operation unit 141, a rotational speed operation unit 142, a first subtraction unit 143, a target speed generation unit 144, a second subtraction unit 145, a proportional element 146, an integral element 147, a derivative element 148, a PID addition unit 150, a Pulse Width Modulation (PWM) output unit 152, and a timer 153.

The position operation unit 141 counts a pulse signal from the rotation detection unit 54 to calculate a rotation position of the driving roller 51a from moment to moment. That is, the PF motor control unit 130 (control unit 110) can detect a rotation position and a rotation direction of the driving roller 51a with a pulse signal from the rotation detection unit 54. The rotational speed operation unit 142 calculates, based on the pulse signal from the rotation detection unit 54, and time measured by the timer 153, a rotational speed of the driving roller 51a.

The first subtraction unit 143 calculates a positional error between a rotation position of the driving roller 51a output from the position operation unit 141 and a target position instructed from the control unit 110. The target speed generation unit 144 calculates, based on the positional error output from the first subtraction unit 143, a target speed in accordance with a predetermined speed table. The second subtraction unit 145 calculates a speed error $\Delta V$ between a rotational speed of the driving roller 51a output from the rotational speed operation unit 142 and a target speed output from the target speed generation unit 144.

The speed error $\Delta V$ output from the second subtraction unit 145 is input to the proportional element 146, the integral element 147, and the derivative element 148. Each element calculates, based on the speed error $\Delta V$, and according to the following formula (1) through formula (3), the following control values Q.

$$QP(j) = \Delta V(j) \times Kp \quad (1)$$

$$QI(j) = QI(j-1) + \Delta V(j) \times Ki \quad (2)$$

$$QD(j) = \{\Delta V(j) - \Delta V(j-1)\} \times Kd \quad (3)$$

where, j is time, Kp is a proportional gain, Ki is an integral gain, and Kd is a derivative gain.

The PID addition unit 150 adds up respective control values output from the proportional element 146, the integral element 147, and the derivative element 148, and outputs a total control value Qpid to the PWM output unit 152. The PWM output unit 152 outputs a PWM signal having a duty value corresponding to the control value Qpid to the motor driver 106. The motor driver 106 performs, based on the PWM signal output from the PWM output unit 152, PWM control to drive the PF motor 53. According to the above-described configuration, the PF motor control unit 130 performs PID control on the PF motor 53. For example, the PF motor control unit 130 performs the PID control on the PF motor 53 during the transport operation.

Note that the PF motor control unit 130 is not limited to the configuration in which the PID control is performed on the PF motor 53, and, for example, a configuration in which PI control is performed on the PF motor 53 may be adopted.

Tension Feedback Control

As described above, in the recording device 10, the PID control is performed on the PF motor 53 during the transport operation. Further, in the recording device 10, tension feedback control is performed on the roll motor 33.

Figure 6:
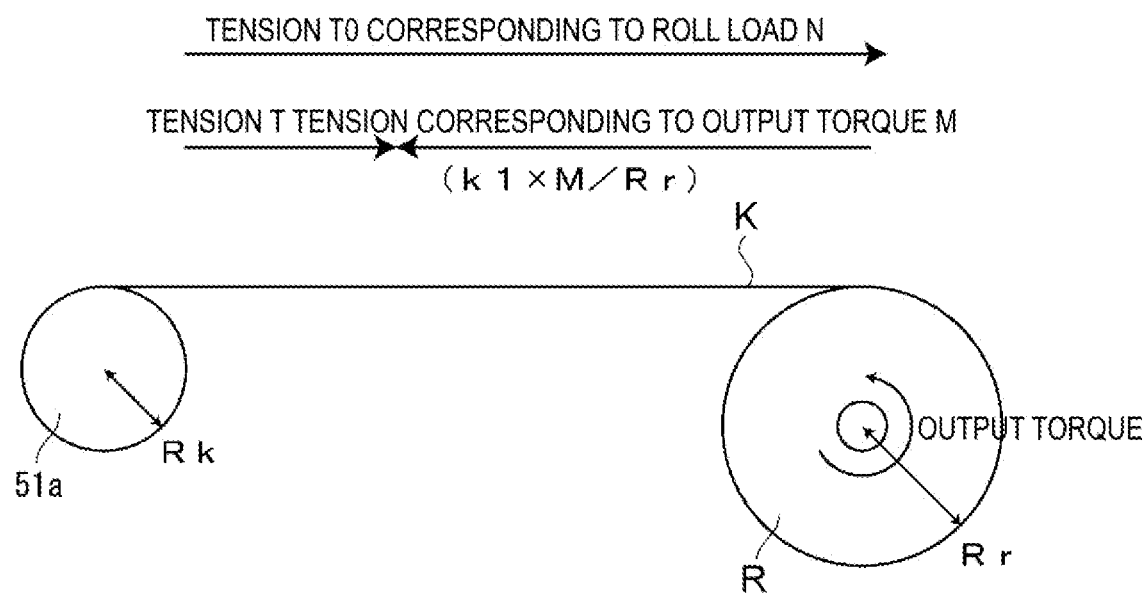
FIG. 6 is a schematic view illustrating relation between an arbitrary rotational speed of a roll body and a roll load necessary to rotate the roll body.
Figure 7:
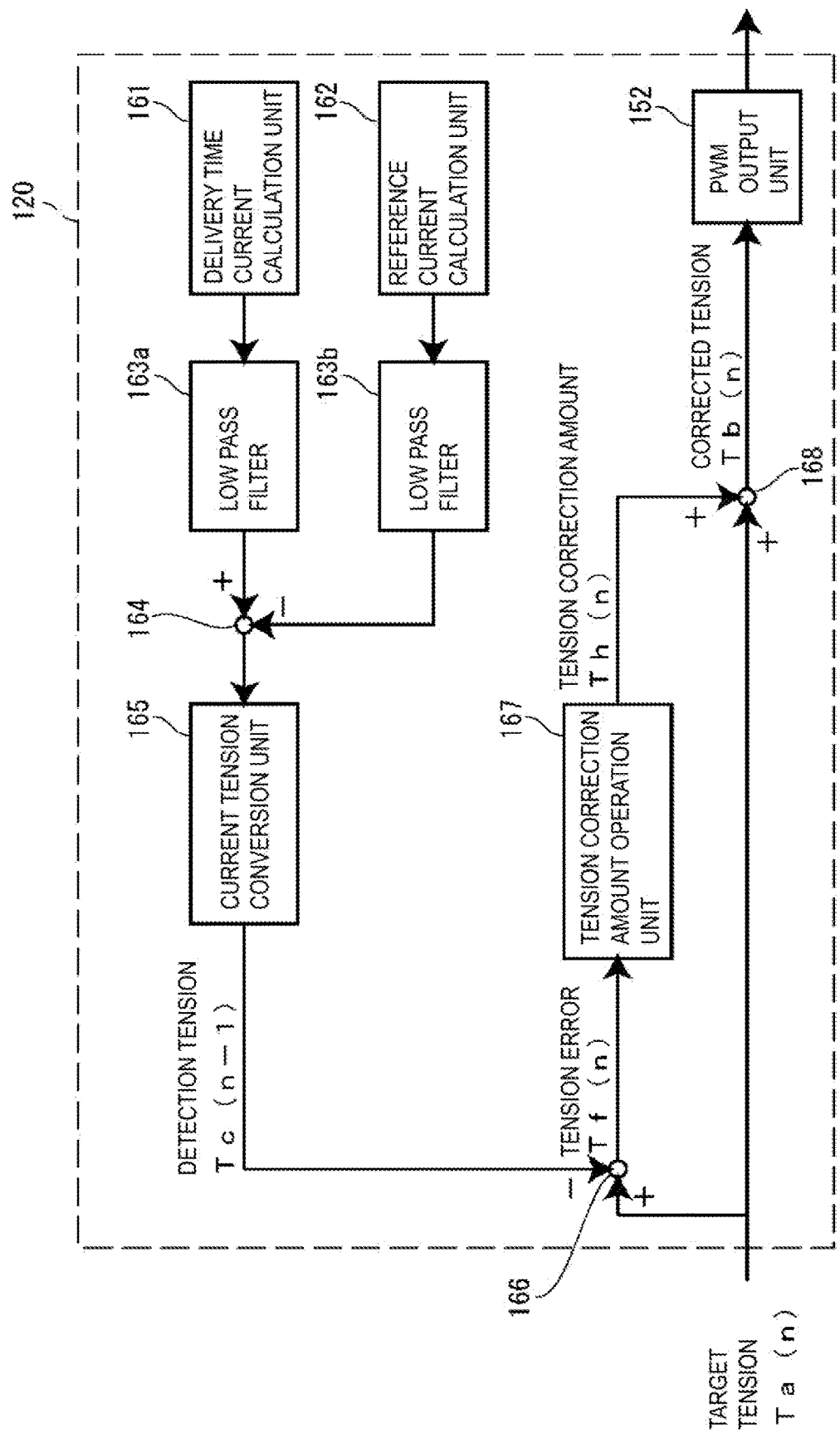
FIG. 7 is a block diagram of a roll motor control unit in a case of realizing tension feedback control.

FIG. 6 is a schematic view illustrating relation between an arbitrary rotational speed of the roll body and a roll load necessary to rotate the roll body. FIG. 7 is a block diagram of a roll motor control unit in the case of realizing the tension feedback control.

Next, with reference to FIG. 6 and FIG. 7, driving control (tension feedback control) of the roll motor 33 will be described.

As illustrated in FIG. 6, a case where the recording device 10 does not drive the roll motor 33 during the transport operation and drives only the PF motor 53 to pull the medium K out of the roll body R, and to deliver the medium K to the recording head 44 side will be described.

In this case, the roll body R is driven to rotate in the delivery rotation direction D2 while the roll body R is being pulled by the medium K. Thus, a roll load N being a load necessary to rotate the roll body R is generated around a rotary shaft of the roll body R. Tension T0 applied at this time to the medium K located between the roll body R and the driving roller 51a can be expressed by formula (4) described below, according to a balance of moment around the rotary shaft of the roll body R.

$$T0 = k1 \times N/Rr \quad (4)$$

k1: a proportional constant
Rr: a radius of the roll body R

A case where the recording device 10 not only drives the PF motor 53 during the transport operation but also drives the roll motor 33 to pull the medium K out of the roll body R, and to deliver the medium K to the recording head 44 side will be described. That is, a situation identical to time of an actual transport operation will be described.

In a case in which the roll motor 33 generates output torque M to rotate the roll body R in the delivery rotation direction D2, torque obtained by subtracting the output torque M from the roll load N acts around the rotary shaft of the roll body R. In this case, tension T can be expressed by formula (5) described below.

$$T = k1 \times (N-M)/Rr \quad (5)$$

According to formula (5), the output torque M of the roll motor 33 can be expressed by formula (6) described below.

$$M = N - \{(Rr/k1) \times T\} \quad (6)$$

Here, the proportional constant k1 is known. For example, a radius Rr of the roll body R can be calculated, based on a count value of the rotation detection unit 34 and a count value of the rotation detection unit 54 obtained when the medium K is delivered by driving only the PF motor 53. It is known that the roll load N has linear correspondence relation with a rotational speed V of the roll body R, and thus the roll load N corresponding to an arbitrary rotational speed can be calculated by linear interpolation of a line segment connecting a roll load N corresponding to a low rotational speed and a roll load N corresponding to a high rotational speed.

Therefore, when first target tension Ta being a target value of the tension T is assigned to T in formula (6), the output torque M of the roll motor 33 can be calculated. Here, the first target tension Ta is set to prevent oblique movement of the medium K or break of the medium K from occurring when the medium K is transported in the transport direction D4.

However, the roll load N is not necessarily stable during transportation of the medium K, and fluctuates in some cases. For example, in a case in which eccentricity of the roll body R, unevenness in specific gravity in a circumferential direction of the roll body R, fluctuation in frictional force between the medium K and a delivery path, fluctuation in Young's modulus of the medium K, or the like exits, the roll load N fluctuates.

In a case in which the roll load N fluctuates and the output torque M is constant, the tension T also fluctuates. In this case, the tension T fluctuates for each transport operation. As a result, a delivery amount fluctuates for each transport operation, and a defect such as banding occurs in an image recorded on the medium K.

Thus, in the recording device 10, the tension feedback control is performed to operate second target tension Tb obtained by correcting the first target tension Ta, and to use the second target tension Tb operated to calculate the output torque M. In other words, in the recording device 10, the first target tension Ta is corrected to make a delivery amount per transport operation constant.

As illustrated in FIG. 7, the roll motor control unit 120 includes a transport current calculation unit 161, a reference current calculation unit 162, low pass filters 163a and 163b, a current subtraction unit 164, a current tension conversion unit 165, a tension subtraction unit 166, a tension correction amount operation unit 167, a tension addition unit 168, and the PWM output unit 152.

The transport current calculation unit 161 acquires a transport current Ia(k) being a current flowing in the PF motor 53 during the transport operation, from the current sensor 58 at a predetermined calculation cycle (e.g., 1 msec cycle). Here, Ia(k) means a transport current Ia calculated at a k-th time at the predetermined calculation cycle. The transport current Ia(k) acquired is input to the current subtraction unit 164 via the low pass filter 163a.

The reference current calculation unit 162 acquires a reference current Ib(k) being a current flowing in the PF motor 53 during a reference current measurement operation, from the current sensor 58 at a calculation cycle identical to the calculation cycle of the transport current calculation unit 161. In this reference current measurement operation, the control unit 110 performs the reference current measurement operation in a state where the medium K located between the driving roller 51a and the roll body R is loosened. That is, the reference current Ib is a current flowing in the PF motor 53 in a state where the medium K located between the driving roller 51a and the roll body R is loosened, and in a case in which the PF motor 53 is driven to cause the medium K to be transported at a transport speed identical to a transport speed during an actual medium transport operation. The control unit 110 performs the reference current measurement operation before starting each recording job, for example.

The control unit 110 stores the acquired reference current Ib(k) in the RAM 103 or the PROM 104, and finishes the reference current measurement operation. The acquired reference current Ib(k) is input to the current subtraction unit 164 via the low pass filter 163b.

Note that the control unit 110 preferably performs a plurality of the reference current measurement operations for each recording job, and the reference current calculation unit 162 preferably acquires an average value of the reference current Ib(k) acquired for each of the plurality of reference current measurement operations as the reference current Ib(k), and preferably enhances precision of the reference current Ib(k) acquired.

The current subtraction unit 164 calculates a tension current Ic(k) by subtracting the reference current Ib(k) from the transport current Ia(k). Then, the current subtraction unit 164 calculates an average tension current Id being an average value of a plurality of the tension currents Ic(k) calculated, and a peak tension current Ie being a maximum value of the plurality of tension currents Ic(k). The calculated average tension current Id and the peak tension current Ie are input to the current tension conversion unit 165.

The current tension conversion unit 165 calculates, based on the average tension current Id, average tension Td, and calculates, based on the peak tension current Ie, a peak tension Te. The average tension Td and the peak tension Te can be obtained according to formula (7) and formula (8) described below, respectively.

$$Td = Id \times Kt \times Z/Rk \qquad (7)$$

$$Te = Ie \times Kt \times Z/Rk \qquad (8)$$

Kt: a torque constant of the PF motor 53
Z: a deceleration ratio of the PF motor 53
Rk: a radius of the driving roller 51a Further, the current tension conversion unit 165 calculates detection tension Tc according to formula (9) described below.

$$Tc = \{Q1 \times Td/(Q1+Q2)\} + \{Q2 \times Te/(Q1+Q2)\} \qquad (9)$$

Here, Q1 and Q2 are arbitrary constants for weighting the average tension Td and the peak tension Te with respect to the detection tension Tc. Values of Q1 and Q2 are set from a viewpoint of how the detection tension Tc correlated with a delivery amount can be calculated from the tension current Ic(k) complicatedly fluctuating during one transport operation. Because a waveform of the tension current Ic(k) changes due to, for example, a delivery speed of the medium K, a delivery amount of the medium K per transport operation, a radius of the roll body R, or the like, a plurality of patterns of the values of Q1 and Q2 is preferably prepared corresponding to the changes.

The tension subtraction unit 166 calculates a tension error Tf(n) being an error between detection tension Tc(n−1) output from the current tension conversion unit 165 and first target tension Ta(n) instructed from the control unit 110.

Note that a value in the parentheses means the number of the transport operations. For example, Ta(n) means the first target tension Ta at an n-th transport operation. The same applies to the following.

The tension correction amount operation unit 167 calculates a tension error integral value Tg(n) obtained by integrating the tension error Tf(n) output from the tension subtraction unit 166, according to formula (10) described below. Further, the tension correction amount operation unit 167 calculates a tension correction amount Th(n) according to formula (11) described below.

$$Tg(n) = Tg(n-1) + Tf(n) \qquad (10)$$

$$Th(n) = Tg(n) \times G \qquad (11)$$

Here, G is a gain.

Note that the tension error integral value Tg is initialized, that is, cleared to 0, by using any one of loading the roll body R, changing the first target tension Ta, and changing a delivery speed of the medium K as a trigger.

The tension addition unit 168 adds up the first target tension Ta(n) instructed from the control unit 110 and the tension correction amount Th(n) output from the tension correction amount operation unit 167, and outputs second target tension Tb(n) being the total to the PWM output unit 152.

The PWM output unit 152 calculates the output torque M of the roll motor 33 by assigning the second target tension Tb(n) output from the tension addition unit 168 to the above-described formula (6). The PWM output unit 152 outputs a PWM signal having a duty value proportional to the output torque M to the motor driver 106. The motor driver 106 performs, based on the PWM signal output from the PWM output unit 152, the PWM control to drive the roll motor 33. Thus, the roll motor control unit 120 can perform control to realize the second target tension Tb(n).

As described above, the tension feedback control feeds detection tension Tc(n−1) obtained at an (n−1)-th transport operation back to an n-th transport operation, to calculate the second target tension Tb(n) obtained by correcting the first target tension Ta(n), and based on the second target tension Tb(n) calculated, controls the roll motor 33 at the n-th transport operation. Thus, at the n-th transport operation, an error of actual tension T with respect to the first target tension Ta(n) can be reduced. As a result, even in a case in which the roll load N fluctuates while the medium K is transported due to eccentricity of the roll body R or the like, fluctuation of the tension T applied to the medium K for each transport operation can be suppressed.

The detection tension Tc, as described in the above-described formula (9), depends on the average tension Td and the peak tension Te. The average tension Td, as described in the above-described formula (7), depends on the average tension current Id (an average value of the tension current Ic). The peak tension Te, as described in the above-described formula (8), depends on the peak tension current Ie (a maximum value of the tension current Ic). Further, the tension current Ic is calculated by the current subtraction unit 164, and is calculated by subtracting the reference current Ib from the transport current Ia, and is a difference between the transport current Ia and the reference current Ib.

That is, the tension feedback control calculates the average tension Td, the peak tension Te, and the detection tension Tc from the tension current Ic being a difference between the transport current Ia and the reference current Ib, feeds the detection tension Tc(n−1) obtained at the (n−1)-th transport operation back to the n-th transport operation, to calculate the second target tension Tb(n) obtained by correcting the first target tension Ta(n), and based on the second target tension Tb(n) calculated, controls the roll motor 33 at the n-th transport operation.

In other words, in the tension feedback control, based on the difference (tension current Ic) between the transport current Ia and the reference current Ib flowing in the PF motor 53 at the (n−1)-th transport operation, the roll motor 33 is driven and controlled at the n-th transport operation. The tension T(n) of the medium K located between the roll body R and the transport mechanism 50 (driving roller 51a) is controlled to be the second target tension Tb(n) by such drive control (tension feedback control) of the roll motor 33.

Then, even in a case in which the roll load N fluctuates while the medium K is transported, the tension T applied to the medium K is controlled by the second target tension Tb(n), and the tension T applied to the medium K is unlikely to fluctuate. Thus, such a defect that fluctuation of the tension T applied to the medium K makes an delivery amount in the transport operation fluctuate, and that quality of an image recorded on the medium K deteriorates owing to banding or the like is suppressed.

Issues about Tension Feedback Control

Next, issues about the tension feedback control will be described.

As described above, the recording device 10 alternately repeats the ink discharge operation and the transport operation, and records an image on the medium K. That is, the recording device 10 performs a plurality of the ink discharge operations and a plurality of the transport operations, and records an image on the medium K.

In the following description, one of the plurality of transport operations is referred to as a medium transport operation.

As described above, in the tension feedback control, based on the difference (tension current Ic) between the transport current Ia flowing in the PF motor 53 during the medium transport operation and the reference current Ib flowing in the PF motor 53 while the medium K is transported in a loosened state, the roll motor 33 is driven and controlled.

The transport current Ia is a current flowing in the PF motor 53 during the medium transport operation, and is measured by the current sensor 58 for each medium transport operation.

The reference current Ib is a current flowing in the PF motor 53 in the state that the medium K located between the driving roller 51*a* and the roll body R is loosened, and in the case in which the PF motor 53 is driven such that the medium K is transported at a transport speed identical to a transport speed during an actual medium transport operation, and is measured by the current sensor 58 for each recording job. That is, the reference current Ib is a current flowing in the PF motor 53 during the reference current measurement operation, and is measured by the current sensor 58 for each recording job.

Figure 8:
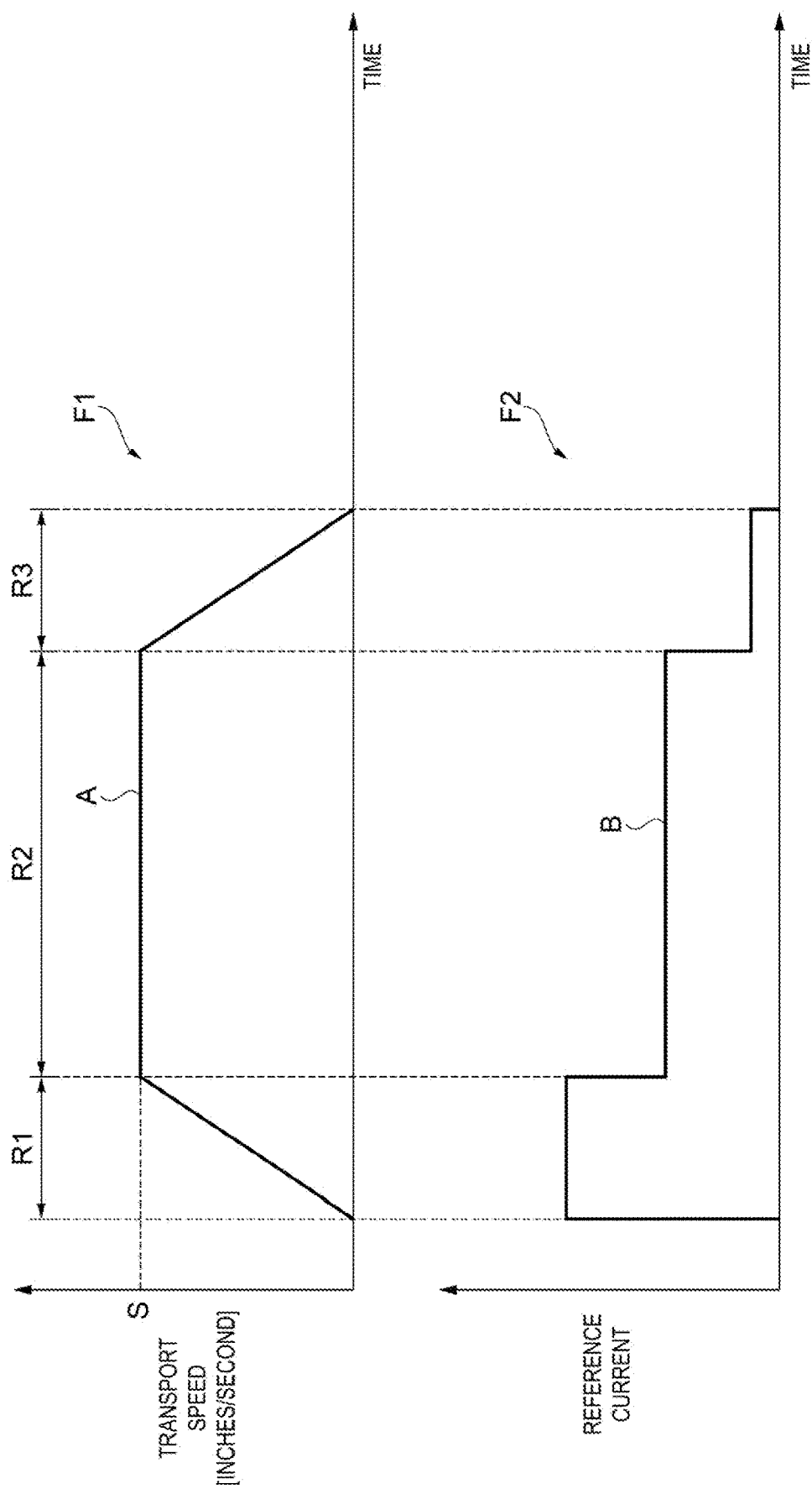
FIG. 8 is a graph illustrating a state of a transport mechanism in a medium transport operation.

FIG. 8 is a graph illustrating a state of the transport mechanism in the medium transport operation.

Specifically, a diagram (graph) denoted by sign F1 in FIG. 8 is a diagram illustrating relation between a transport speed and time T of the medium K in the medium transport operation, a vertical axis is the transport speed of the medium K, and a horizontal axis is the time T. In other words, the diagram denoted by sign F1 in FIG. 8 is a diagram illustrating a change over time of the transport speed of the medium K in the medium transport operation. Then, a line segment A illustrated in the diagram denoted by sign F1 in FIG. 8 is an example of a "speed profile" and illustrates a state of a change over time of the transport speed in the medium transport operation. In the following description, the line segment A illustrated in the diagram denoted by sign F1 in FIG. 8 is referred to as a speed profile A.

A diagram (graph) denoted by sign F2 in FIG. 8 is a diagram illustrating relation between the reference current Ib and time T in the medium transport operation, a vertical axis is the reference current Ib, and a horizontal axis is the time T. In other words, the diagram denoted by sign F2 in FIG. 8 is a diagram illustrating a change over time of the reference current Ib flowing in the PF motor 53 in the medium transport operation. Then, a line segment B illustrated in the diagram denoted by sign F2 in FIG. 8 is an example of a "current profile" and illustrates a state of a change over time of the reference current Ib in the medium transport operation. In the following description, the line segment B illustrated in the diagram denoted by sign F2 in FIG. 8 is referred to as a current profile B.

As illustrated in FIG. 8, in a case in which the PF motor 53 is driven to transport the medium K in the medium transport operation, each of the transport speed of the medium K and the reference current Ib of the PF motor 53 includes an acceleration region R1, a constant speed region R2, and a deceleration region R3. In the acceleration region R1, the transport speed of the medium K is gradually accelerated. In the constant speed region R2, the transport speed of the medium K is constant, and the transport speed of the medium K is denoted by S. In the deceleration region R3, the transport speed of the medium K is gradually decelerated. Then, in the medium transport operation, the medium K is transported by a constant delivery amount through the acceleration region R1, the constant speed region R2, and the deceleration region R3.

In other words, the speed profile A in the recording device 10 includes the acceleration region R1 in which the transport speed of the medium K increases along with the time T, the constant speed region R2 in which the transport speed of the medium K is constant with respect to the time T, and the deceleration region R3 in which the transport speed of the medium K decreases along with the time T.

Note that the transport speed of the medium K is an example of a "transport speed of a medium." Further, in the following description, a transport speed S of the medium K in the constant speed region R2 is abbreviated as the transport speed S.

In the recording device 10, rather than a single condition, a plurality of conditions exists for the transport speed S. Specifically, three conditions, that is, a condition in which the transport speed S is 1 inch/second, a condition in which the transport speed S is 3 inches/second, and a condition in which the transport speed S is 5 inches/second exist.

In other words, the recording device 10 includes a transport speed mode in which the transport speed S is 1 inch/second, a transport speed mode in which the transport speed S is 3 inches/second, and a transport speed mode in which the transport speed S is 5 inches/second. That is, the recording device 10 includes a plurality of the transport speed modes.

Then, in the recording device 10, the driving roller 51*a* (transport unit) transports the medium K in the plurality of transport speed modes, the PF motor 53 (driving unit) drives the driving roller 51*a* with a plurality of the speed profiles A corresponding to the plurality of transport speed modes.

Further, in the case of driving the PF motor 53 to transport the loosened medium K with the speed profile A, the control unit 110 acquires the current profile B, based on the reference current Ib flowing in the PF motor 53 (the reference current Ib measured by the current sensor 58), and time measured by the timer 153. In other words, the control unit 110 acquires the current profile B corresponding to the speed profile A from the reference current Ib.

Before start of a recording job, the reference current measurement operation is performed, and the reference current Ib is measured by the current sensor 58. The control unit 110 acquires the current profile B corresponding to the speed profile A from the reference current Ib measured by the current sensor 58 and the time measured by the timer 153, and saves (stores) in the RAM 103 or the PROM 104. Specifically, the control unit 110 acquires a current profile B1 corresponding to a speed profile A1 of the transport speed mode in which the transport speed S is 1 inch/second, a current profile B3 corresponding to a speed profile A3 of the transport speed mode in which the transport speed S is 3 inches/second, and a current profile B5 corresponding to a speed profile A5 of the transport speed mode in which the transport speed S is 5 inches/second, and saves (stores) the current profile B (the current profiles B1, B3, B5) in the RAM 103 or the PROM 104.

Further, the reference current Ib (current profile B) is a reference in a case in which the tension feedback control is performed.

The operation in which the control unit 110 acquires the current profile B and stores the current profile B in the RAM 103 or the PROM 104 is performed for each recording job.

That is, the operation in which the control unit 110 acquires the current profile B and stores the current profile B in the RAM 103 or the PROM 104 is performed each time the conditions for the transport speed S are switched.

When the control unit 110 acquires the current profile B, the reference current Ib measurement needs to be performed in the state that the medium K located between the driving roller 51a and the roll body R is loosened. As described above, a purpose of acquiring the current profile B is to acquire in advance parameters necessary for the ink discharge operation. Therefore, a duration in which the current profile B is being acquired is waiting time for the recording device 10 in which no ink discharge operation is performed.

Further, as the number of conditions for a recording job (conditions for the transport speed S) increases, the number of times the current profile B is acquired increases, and time for acquiring the current profile B is lengthened, and thus the waiting time for the recording device 10 is lengthened. In addition, because the reference current Ib (current profile B) is a reference in performing the tension feedback control, to enhance precision of the tension feedback control, a plurality of measurement results is preferably averaged to acquire the reference current Ib (current profile B). When the reference current Ib is measured a plurality of times, the time for acquiring the current profile B is further lengthened, and thus the waiting time for the recording device 10 is further lengthened.

Therefore, when the tension feedback control is performed in the recording device 10, time for performing the reference current measurement operation is lengthened, and the time for acquiring the current profile B is lengthened. Thus, there has been such an issue that the waiting time for the recording device 10 is lengthened and productivity of the recording device 10 lowers.

A control method for the recording device 10 according to the exemplary embodiment includes an excellent configuration in which the time for the control unit 110 to acquire the current profile B can be shorten and the productivity of the recording device 10 can be enhanced, and the details will be described below.

Control Method for Recording Device

Figure 9:
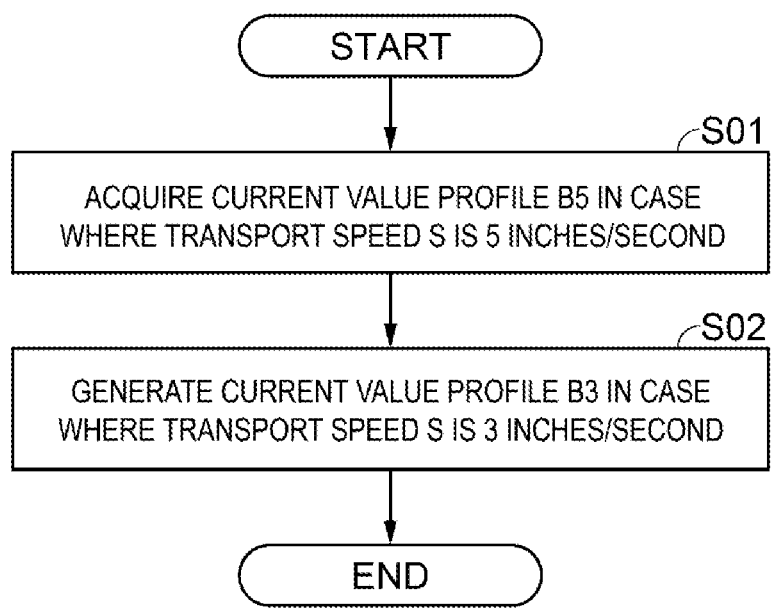
FIG. 9 is a process flow illustrating a control method for a recording device according to an exemplary embodiment.
Figure 10:
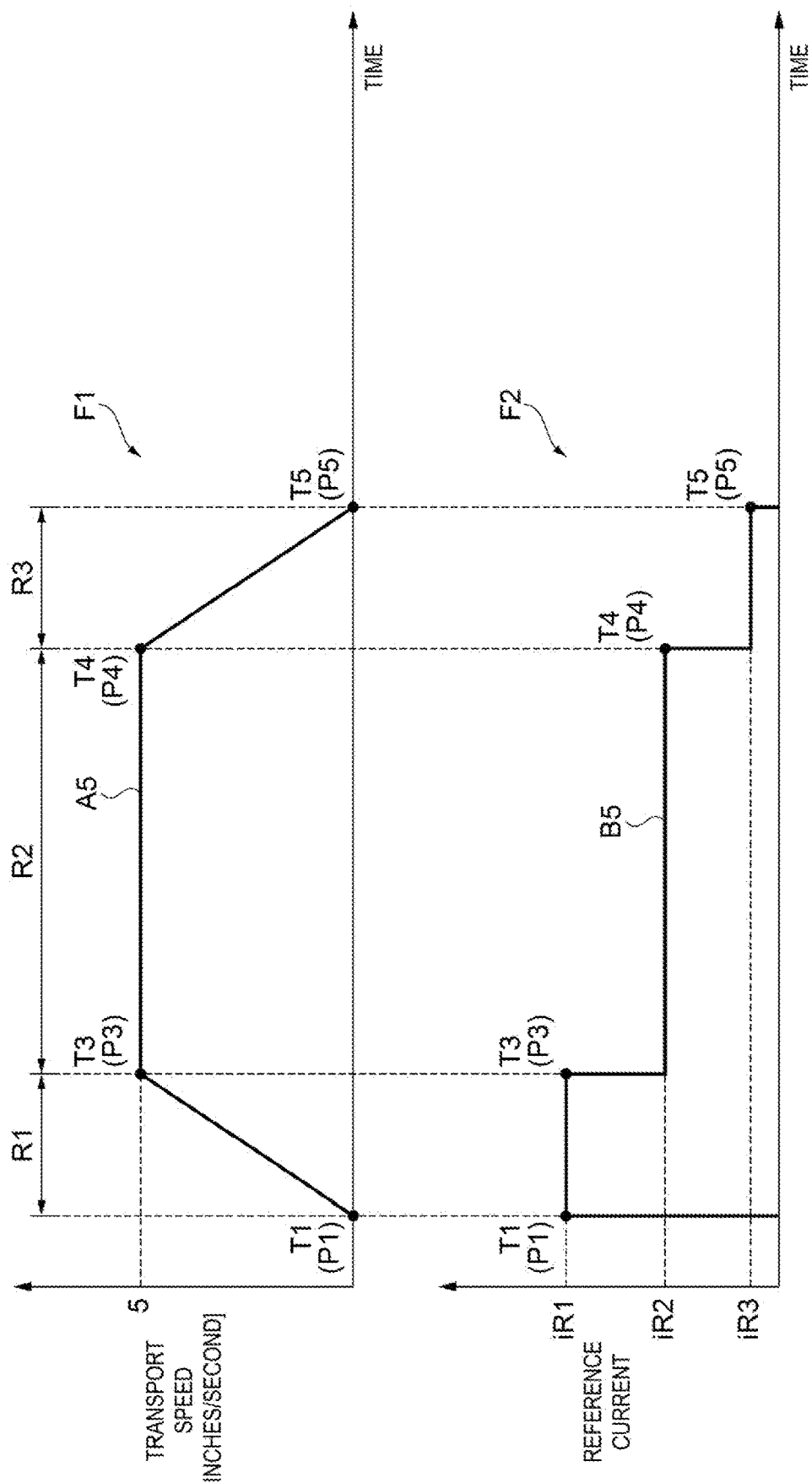
FIG. 10 is a graph illustrating a state of a transport mechanism in a medium transport operation.
Figure 11:
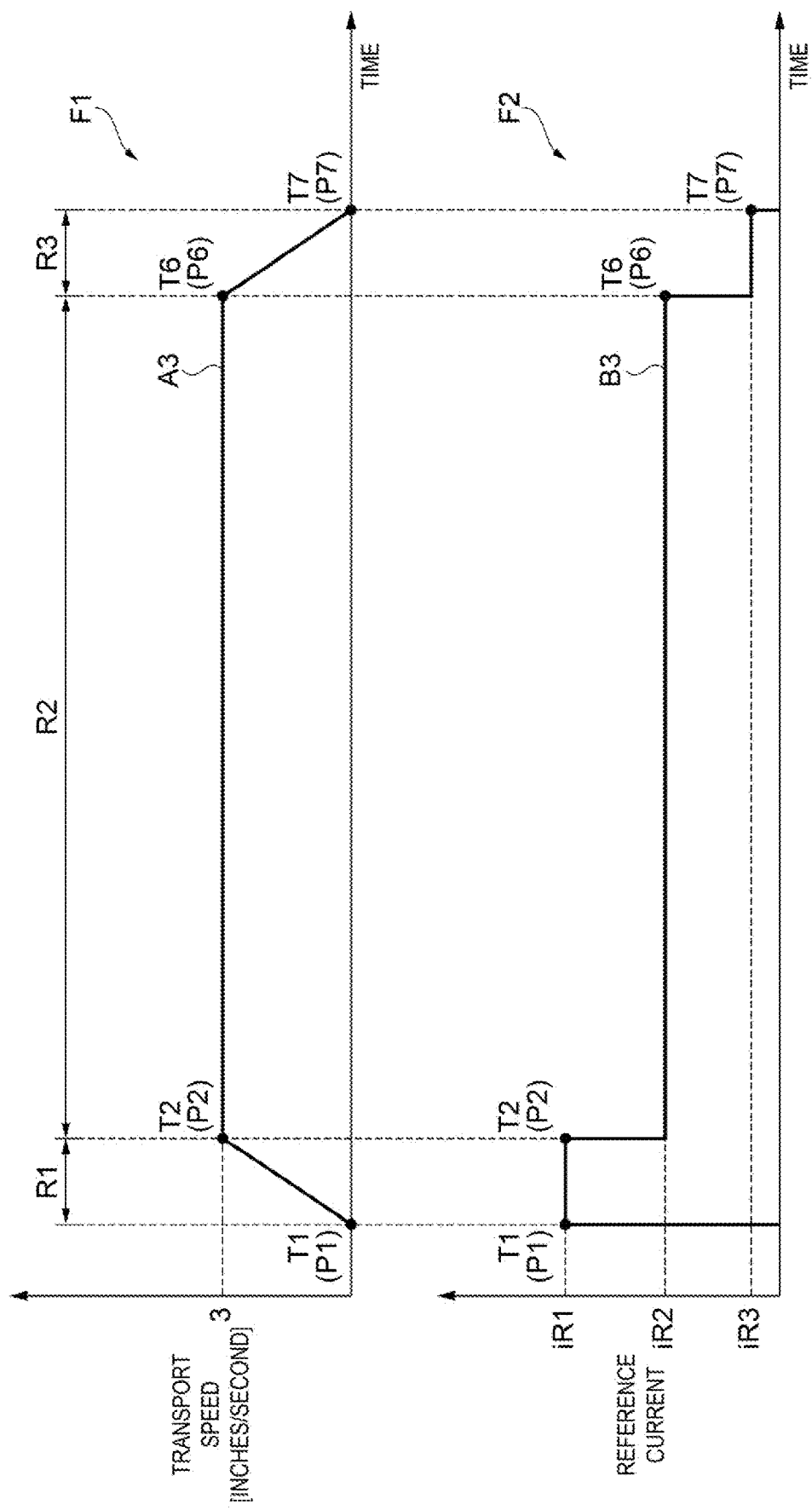
FIG. 11 is a graph illustrating a state of the transport mechanism in the medium transport operation.
Figure 12:
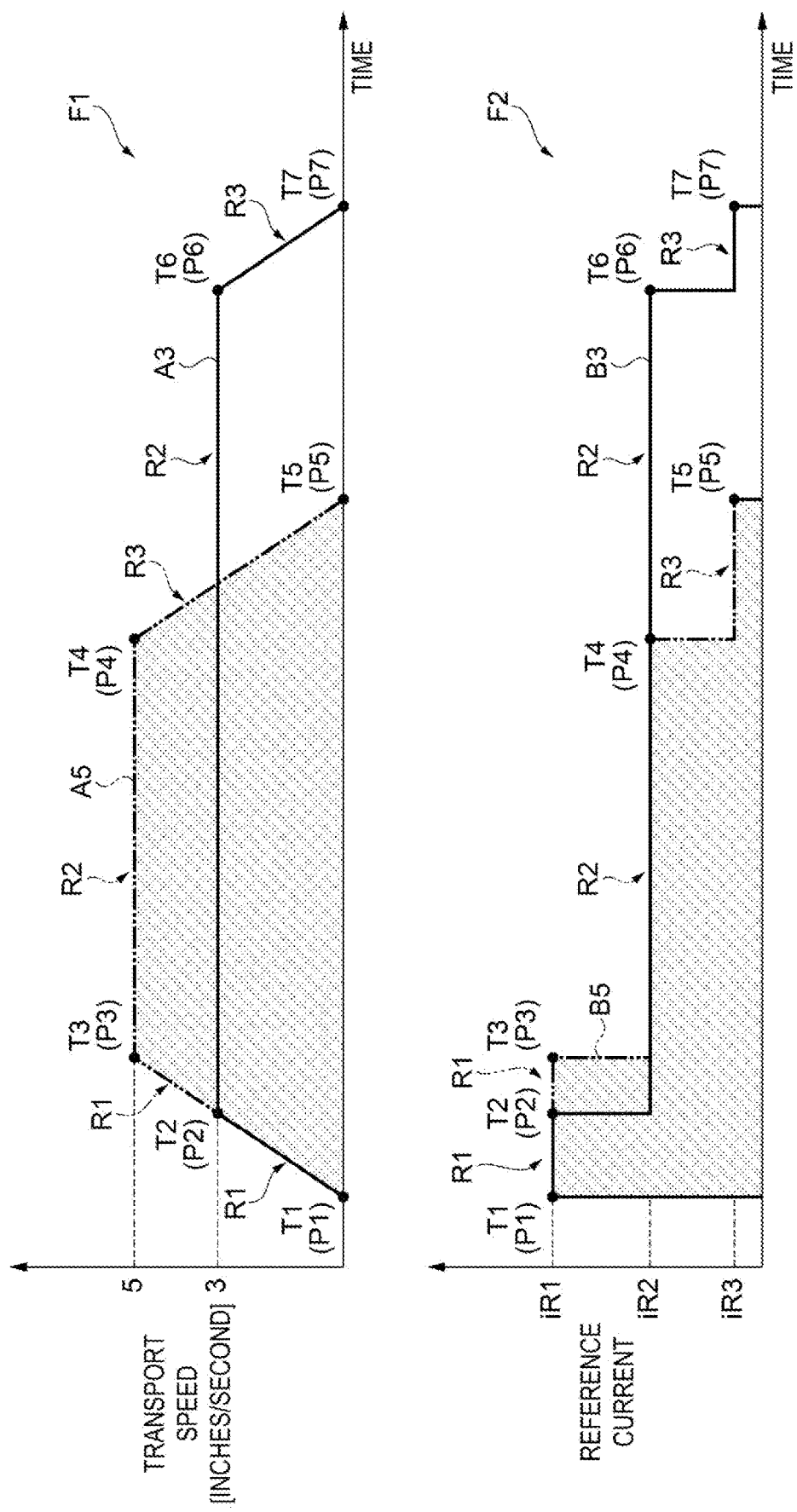
FIG. 12 is a graph illustrating a state of the transport mechanism in the medium transport operation.

FIG. 9 is a process flow illustrating a control method for the recording device according to the exemplary embodiment. Each of FIG. 10 through FIG. 12 is a diagram corresponding to FIG. 8 and is a graph illustrating a state of the transport mechanism in the medium transport operation. Specifically, in a diagram denoted by sign F1 in each of FIG. 10 through FIG. 12, relation between a transport speed and time T of the medium K in the medium transport operation is illustrated, and in a diagram denoted by sign F2 in each of FIG. 10 through FIG. 12, relation between the reference current Ib and time T in the medium transport operation is illustrated.

Further, in the diagram denoted by sign F1 in FIG. 10, the speed profile A5 in the case in which the transport speed S is 5 inches/second is illustrated, and in the diagram denoted by sign F2 in FIG. 10, the current profile B5 in the case in which the transport speed S is 5 inches/second is illustrated. In the diagram denoted by sign F1 in FIG. 11, the speed profile A3 in the case in which the transport speed S is 3 inches/second is illustrated, and in the diagram denoted by sign F2 in FIG. 11, the current profile B3 in the case in which the transport speed S is 3 inches/second is illustrated.

In the diagram denoted by sign F1 in FIG. 12, a state in which the speed profile A3 and the speed profile A5 are overlapped is illustrated, the speed profile A3 is illustrated by a solid line, the speed profile A5 is illustrated by a dashed-two dotted line, and further, hatching is applied to make a state of the speed profile A5 comprehensible. In the diagram denoted by sign F2 in FIG. 12, a state in which the current profile B3 and the current profile B5 are overlapped is illustrated, the current profile B3 is illustrated by a solid line, the current profile B5 is illustrated by a dashed-two dotted line, and further, hatching is applied to make a state of the current profile B5 comprehensible.

That is, FIG. 12 is obtained by overlapping the profiles illustrated in FIG. 11 and the profiles illustrated in FIG. 10. In FIG. 12, the respective profiles illustrated in FIG. 11 are illustrated by solid lines and the respective profiles illustrated in FIG. 10 are illustrated by dashed-two dotted lines.

Further, in the speed profile A (line segment A) and the current profile B (line segment B) in each of FIG. 10 through FIG. 12, time T1 through time T7 are denoted by black circles.

As illustrated in FIG. 9, the control method for the recording device 10 according to the exemplary embodiment includes a process for acquiring the current profile B5 in the case in which the transport speed S is 5 inches/second (step S01), and a process for acquiring the current profile B3 in the case in which the transport speed S is 3 inches/second (step S02).

Note that step S01 is an example of the "process for acquiring the first current profile." Step S02 is an example of the "process for generating the second current profile."

Further, in the following description, the transport speed modes in the recording device 10 include the transport speed mode in which the transport speed S is 5 inches/second as an example of the "first transport speed mode," and the transport speed mode in which the transport speed S is 3 inches/second as an example of the "second transport speed mode." In other words, the plurality of transport speed modes include the first transport speed mode (transport speed mode in which the transport speed S is 5 inches/second), and the second transport speed mode (transport speed mode in which the transport speed S is 3 inches/second) in which the transport speed is slower than that in the first transport speed mode.

Then, the speed profile A5 corresponding to the transport speed mode in which the transport speed S is 5 inches/second (first transport speed mode) is an example of the "first speed profile." The speed profile A3 corresponding to the transport speed mode in which the transport speed S is 3 inches/second (second transport speed mode) is an example of the "second speed profile." In other words, the plurality of speed profiles includes the first speed profile corresponding to the first transport speed mode (speed profile A5) and the second speed profile corresponding to the second transport speed mode (speed profile A3).

Further, the current profile B5 corresponding to the speed profile A5 (first speed profile) is an example of the "first current profile." The current profile B3 corresponding to the speed profile A3 (second speed profile) is an example of the "second current profile." In other words, the current profiles corresponding to the speed profiles include the first current profile (current profile B5) corresponding to the first speed profile (speed profile A5), and the second current profile (current profile B3) corresponding to the second speed profile (speed profile A3).

At step S01, first, the control unit 110 rotates the roll body R in the delivery rotation direction D2, and loosens the medium K located between the driving roller 51a and the roll body R. Subsequently, in the state that the medium K located between the driving roller 51a and the roll body R is loosened, the control unit 110 drives the PF motor 53 to cause the medium K to be transported in the transport speed mode in which the transport speed S is 5 inches/second, and the current sensor 58 discretely measures the reference current Ib flowing in the PF motor 53 at this time. Then, the control unit 110 acquires the current profile B5 illustrated in the diagram denoted by sign F2 in FIG. 10, based on the reference current Ib measured by the current sensor 58 and the time T measured by the timer 153.

That is, in step S01, in the case of a condition in which the transport speed S is the fastest (the speed profile A5 illustrated in the diagram denoted by sign F1 in FIG. 10), the reference current Ib flowing in the PF motor 53 is actually measured, and the control unit 110 acquires, based on the actually measured reference current Ib and the measured time T, the current profile B5 illustrated in the diagram denoted by sign F2 in FIG. 10.

In other words, the control unit 110 acquires the first current profile (current profile B5) from the reference current Ib in the case in which the medium K is transported in the first transport speed mode (transport speed mode in which the transport speed S is 5 inches/second). That is, at step S01, in a case in which the medium K is transported in the first transport speed mode (transport speed mode in which the transport speed S is 5 inches/second), the control unit 110 acquires the first current profile (current profile B5) from the reference current Ib.

Note that at step S01, because the current sensor 58 discretely measures the reference current Ib to acquire the current profile B5, time for acquiring the current profile B5 can be shortened, as compared to a case where the current sensor 58 continuously measures the reference current to acquire the current profile B5.

As illustrated in the diagram denoted by sign F1 in FIG. 10, in the line segment A (speed profile A5) from the time T1 to time T3 denoted by black circles in the diagram, the transport speed of the medium K is accelerated from 0 inches/second to 5 inches/second, in the line segment A (speed profile A5) from the time T3 to time T4, the transport speed of the medium K is kept at 5 inches/second, and in the line segment A (speed profile A5) from the time T4 to time T5, the transport speed of the medium K is decelerated from 5 inches/second to 0 inches/second. Therefore, a region from the time T1 to the time T3 is the acceleration region R1 in the speed profile A5, a region from the time T3 to the time T4 is the constant speed region R2 in the speed profile A5, and a region from the time T4 to the time T5 is the deceleration region R3 in the speed profile A5.

As illustrated in the diagram denoted by sign F2 in FIG. 10, a region from the time T1 to the time T3 is the acceleration region R1 in the current profile B5, a region from the time T3 to the time T4 is the constant speed region R2 in the current profile B5, and a region from the time T4 to the time T5 is the deceleration region R3 in the current profile B5.

Further, the reference current Ib in the acceleration region R1 is constant at iR1, the reference current Ib in the constant speed region R2 is constant at iR2, and the reference current Ib in the deceleration region R3 is constant at iR3. The reference current Ib stepwise lowers, along with the acceleration region R1 (reference current iR1), the constant speed region R2 (reference current iR2), and the deceleration region R3 (reference current iR3). In other words, when the control unit 110 controls the PF motor 53 to have a desired transport speed, the reference current Ib in the acceleration region R1 is constant at iR1, the reference current Ib in the constant speed region R2 is constant at iR2, and the reference current Ib in the deceleration region R3 is constant at iR3.

When the transport speed of the medium K is accelerated from 0 inches/second to 5 inches/second, the reference current Ib reaches iR1 in the acceleration region R1. Additionally, because inclination of the line segment A in the acceleration region R1 corresponds to acceleration, in a case in which the inclination of the line segment A in the acceleration region R1 is steep, the transport speed of the medium K rapidly increases, and in a case in which the inclination of the line segment A in the acceleration region R1 is moderate, the transport speed of the medium K slowly increases.

When the transport speed of the medium K is accelerated to 5 inches/second in the acceleration region R1, the reference current Ib is set to iR2 being lower than iR1. In a state where the transport speed of the medium K is kept at 5 inches/second, the reference current Ib is also kept at iR2 being lower than iR1. That is, in the case in which the transport speed of the medium K is kept at the constant transport speed (5 inches/second) by the control unit 110, the reference current Ib is set to iR2.

Further, when the transport speed of the medium K is decelerated from 5 inches/second to 0 inches/second (stop state), the reference current Ib is set to iR3 being lower than iR2. That is, in a region in which the transport speed of the medium K is decelerated from 5 inches/second to 0 inches/second (stop state), the reference current Ib is set further lower than iR3 and iR2. Additionally, because inclination of the line segment A in the deceleration region R3 corresponds to acceleration, in a case in which the inclination of the line segment A in the deceleration region R3 is steep, the transport speed of the medium K rapidly decreases, and in a case in which the inclination of the line segment A in the deceleration region R3 is moderate, the transport speed of the medium K slowly decreases.

At step S02, the control unit 110 generates, from the current profile B5 acquired at step S01, in the state where the medium K located between the driving roller 51a and the roll body R is loosened, the current profile B3 in the case in which the medium K is transported in the transport speed mode in which the transport speed S is 3 inches/second. That is, at step S02, from the current profile B5 acquired at step S01 illustrated in FIG. 9, the current profile B3 illustrated in the diagram denoted by sign F2 in FIG. 11 is generated.

As illustrated in the diagram denoted by sign F2 in FIG. 11, a region from the time T1 to the time T2 is the acceleration region R1 in the current profile B3, a region from the time T2 to the time T6 is the constant speed region R2 in the current profile B3, and a region from the time T6 to the time T7 is the deceleration region R3 in the current profile B3.

As illustrated in the diagram denoted by sign F1 in FIG. 11, a region from the time T1 to the time T2 is the acceleration region R1 in the speed profile A3, a region from the time T2 to the time T6 is the constant speed region R2 in the speed profile A3, and a region from the time T6 to the time T7 is the deceleration region R3 in the speed profile A3.

Additionally, a delivery amount of the medium K in the medium transport operation is identical in the case in which the medium K is transported in the transport speed mode in which the transport speed S is 5 inches/second and in the case in which the medium K is transported in the transport speed mode in which the transport speed S is 3 inches/second. Thus, time necessary for the medium transport operation is shorter in the case in which the medium K is transported in the transport speed mode in which the transport speed S is 5 inches/second, and is longer in the case in which the medium K is transported in the transport speed mode in which the transport speed S is 3 inches/second.

As illustrated in the diagram denoted by sign F1 in FIG. 12, the control unit 110 controls driving of the PF motor 53 to make the acceleration in the acceleration region R1 (the inclination of the line segment A in the acceleration region R1) identical in the case in which the medium K is transported in the transport speed mode in which the transport speed S is 5 inches/second and in the case in which the medium K is transported in the transport speed mode in which the transport speed S is 3 inches/second. Further, the control unit 110 controls driving of the PF motor 53 to make the acceleration in the deceleration region R3 (the inclination of the line segment A in the deceleration region R3) identical in the case in which the medium K is transported in the transport speed mode in which the transport speed S is 5 inches/second and in the case in which the medium K is transported in the transport speed mode in which the transport speed S is 3 inches/second.

As illustrated in the diagram denoted by sign F2 in FIG. 12, because the acceleration in the acceleration region R1 is identical in the case in which the medium K is transported in the transport speed mode in which the transport speed S is 5 inches/second and in the case in which the medium K is transported in the transport speed mode in which the transport speed S is 3 inches/second, the reference current Ib in the acceleration region R1 is identical in the case in which the medium K is transported in the transport speed mode in which the transport speed S is 5 inches/second, and in the case in which the medium K is transported in the transport speed mode in which the transport speed S is 3 inches/second. Thus, in the case in which the medium K is transported in the transport speed mode in which the transport speed S is 3 inches/second, the reference current Ib in the acceleration region R1 is iR1.

Because the acceleration in the deceleration region R3 is identical in the case in which the medium K is transported in the transport speed mode in which the transport speed S is 5 inches/second and in the case in which the medium K is transported in the transport speed mode in which the transport speed S is 3 inches/second, the reference current Ib in the deceleration region R3 is identical in the case in which the medium K is transported in the transport speed mode in which the transport speed S is 5 inches/second, and in the case in which the medium K is transported in the transport speed mode in which the transport speed S is 3 inches/second. Thus, in the case in which the medium K is transported in the transport speed mode in which the transport speed S is 3 inches/second, the reference current Ib in the deceleration region R3 is iR3.

Further, the reference current Ib in the constant speed region R2 is a current flowing in the PF motor 53 when the PF motor 53 is driven to keep the transport speed of the medium K accelerated in the acceleration region R1, and is identical in the case in which the medium K is transported in the transport speed mode in which the transport speed S is 5 inches/second and in the case in which the medium K is transported in the transport speed mode in which the transport speed S is 3 inches/second. That is, in the case in which the transport speed of the medium K is accelerated to 5 inches/second in the acceleration region R1, the accelerated transport speed (5 inches/second) in the acceleration region R1 is kept in the constant speed region R2, and the reference current at this time is set to iR1 at the time T3. Additionally, in the case in which the transport speed of the medium K is accelerated to 3 inches/second in the acceleration region R1, the accelerated transport speed (3 inches/second) in the acceleration region R1 is kept in the constant speed region R2, and the reference current at this time is set to iR1 at P2. At this time, in the case in which the medium K is transported in the transport speed mode in which the transport speed S is 3 inches/second, the reference current Ib in the constant speed region R2 after the time T2 is set to iR2 (<iR1).

As described above, in the control method for the recording device 10 according to the exemplary embodiment, the control unit 110 controls the PF motor 53 to make the current flowing in the PF motor 53 (reference current Ib) in the acceleration region R1, the constant speed region R2, and the deceleration region R3 identical in the transport speed mode in which the transport speed S is 5 inches/second and in the transport speed mode in which the transport speed S is 3 inches/second. According to such control, at step S02, the current profile B3 can be generated by using the current profile B5 acquired at step S01.

In the following description, the current profile B5 acquired at step S01 is referred to as a reference current profile B5. Further, the current profile B3 generated at step S02 is referred to as a generated current profile B3.

In the case in which the medium K is transported in the transport speed mode in which the transport speed S is 5 inches/second, as illustrated in FIG. 10, a position P of the medium K at a point in time (the time T1) at which acceleration of the medium K starts in the medium transport operation is a position P1. The position P of the medium K at a point in time (the time T3) at which the acceleration of the medium K ends is a position P3. The position P of the medium K at a point in time (the time T4) at which deceleration of the medium K starts is a position P4. The position P of the medium K at a point in time (the time T5) at which the deceleration of the medium K ends is a position P5.

As describe above, the rotation detection unit 54 detects the rotation position and the rotation direction of the driving roller 51a. The control unit 110 can acquire the position P of the medium K with a signal from the rotation detection unit 54, and acquire the delivery amount of the medium K (a change amount of the position P of the medium K) in the medium transport operation. Further, the control unit 110 can acquire a state of change in the transport speed of the medium K (acceleration), and the position P of the medium K, with the signal from the rotation detection unit 54 and a signal from the timer 153.

In the exemplary embodiment, the medium transport operation in which the transport speed S is 5 inches/second is pre-evaluated, and the control unit 110 acquires the position P1, the position P3, the position P4, and the position P5 in advance, and saves (stores) respective pieces of information about the position P3, the position P4, and the position P5 in the RAM 103 or the PROM 104 as relative values with respect to the position P1. That is, the control unit 110 saves (stores) the respective pieces of information about the position P1, the position P3, the position P4, and the position P5 in the RAM 103 or the PROM 104 in advance.

Because the position P1 corresponds to the time T1, the position P3 corresponds to the time T3, the position P4 corresponds to the time T4, and the position P5 corresponds to the time T5, respective pieces of information about the time T1, the time T3, the time T4, and the time T5 are saved (stored) in the RAM 103 or the PROM 104 in advance as the respective pieces of information about the position P1, the position P3, the position P4, and the position P5.

In the case in which the medium K is transported in the transport speed mode in which the transport speed S is 3 inches/second, as illustrated in FIG. 11, the position P of the medium K at a point in time (the time T1) at which acceleration of the medium K starts in the medium transport operation is a position P1. The position P of the medium K at a point in time (the time T2) at which the acceleration of the medium K ends is a position P2. The position P of the medium K at a point in time (the time T6) at which deceleration of the medium K starts is a position P6. The position P of the medium K at a point in time (the time T7) at which the deceleration of the medium K ends is a position P7.

In the exemplary embodiment, the medium transport operation in which the transport speed S is 3 inches/second is pre-evaluated, and the control unit 110 acquires the position P1, the position P2, the position P6, and the position P7 in advance, and saves (stores) respective pieces of information about the position P2, the position P6, and the position P7 in the RAM 103 or the PROM 104 as relative values with respect to the position P1. That is, the control unit 110 saves (stores) the respective pieces of information about the position P1, the position P2, the position P6, and the position P7 in the RAM 103 or the PROM 104 in advance.

Because the position P1 corresponds to the time T1, the position P2 corresponds to the time T2, the position P6 corresponds to the time T6, and the position P7 corresponds to the time T7, the pieces of information about the time T1, the time T2, the time T6, and the time T7 are saved (stored) in the RAM 103 or the PROM 104 in advance as the respective pieces of information about the position P1, the position P2, the position P6, and the position P7.

As described above, the control unit 110 saves (stores) the pieces of information about the time T1, the time T2, the time T3, the time T4, the time T5, the time T6, and the time T7 in the RAM 103 or the PROM 104 in advance as the respective pieces of information about the position P1, the position P2, the position P3, the position P4, the position P5, the position P6, and the position P7. Then, in the reference current measurement operation, the control unit 110 can acquire the respective pieces of information about the time T1, the time T2, the time T3, the time T4, the time T5, the time T6, and the time T7, from the respective pieces of information about the position P1, the position P2, the position P3, the position P4, the position P5, the position P6, and the position P7 saved (stored) in the RAM 103 or the PROM 104 in advance.

As illustrated in the diagram denoted by sign F2 in FIG. 12, an outline of a hatched region (the line segment B illustrated by the dashed-two dotted line) is the reference current profile B5 acquired at step S01. Further, the line segment B illustrated by the solid line is the generated current profile B3.

At step S02, in the acceleration region R1, because the reference current Ib of the reference current profile B5 is identical to the reference current Ib of the generated current profile B3, the control unit 110 sets a portion from the position P1 (the time T1) to the position P2 (the time T2) in the reference current profile B5 to the generated current profile B3 in the acceleration region R1. That is, the control unit 110 uses the portion from the position P1 (the time T1) to the position P2 (the time T2) in the reference current profile B5 to generate the generated current profile B3 in the acceleration region R1. That is, the control unit 110 uses the reference current profile B5 until a predetermined time (the time T2) in the acceleration region R1 and generates the generated current profile B3 in the acceleration region R1.

In other words, the control unit 110 acquires the first current profile (reference current profile B5) from the reference current Ib in the case in which the medium K is transported in the first transport speed mode (transport speed mode in which the transport speed S is 5 inches/second), and further uses the first current profile (reference current profile B5) until the predetermined time (the time T2) in the acceleration region R1 and generates the second current profile (generated current profile B3) in the acceleration region R1.

In the constant speed region R2, because the reference current Ib of the reference current profile B5 is identical to the reference current Ib of the generated current profile B3, the control unit 110 sets the reference current Ib of the reference current profile B5 in the constant speed region R2 to the reference current Ib of the generated current profile B3 in the constant speed region R2. Further, the control unit 110 generates, from the reference current Ib of the reference current profile B5 in the constant speed region R2, the position P2 (the time T2) and the position P6 (the time T6), the generated current profile B3 in the constant speed region R2.

In other words, the control unit 110 uses the first current profile (reference current profile B5) in the constant speed region R2 and generates the second current profile (generated current profile B3) in the constant speed region R2. That is, at step S02, the control unit 110 uses the first current profile (reference current profile B5) and generates the second current profile (generated current profile B3).

In the deceleration region R3, because the reference current Ib of the reference current profile B5 is identical to the reference current Ib of the generated current profile B3, the control unit 110 sets the reference current Ib of the reference current profile B5 in the deceleration region R3 to the reference current Ib of the generated current profile B3 in the deceleration region R3. Further, the control unit 110 generates, from the reference current Ib of the reference current profile B5 in the deceleration region R3, the position P6 (the time T6) and the position P7 (the time T7), the generated current profile B3 in the deceleration region R3.

Then, the control unit 110 generates, from the generated current profile B3 in the acceleration region R1, the generated current profile B3 in the constant speed region R2, and the generated current profile B3 in the deceleration region R3, the generated current profile B3.

Further, as with the method for generating the generated current profile B3 at step S02, the control unit 110 uses the reference current profile B5 to generate a current profile B1 (generated current profile B1) in a case in which the medium K is transported in the transport speed mode in which the transport speed S is 1 inch/second.

As described above, in the control method for the recording device 10 according to the exemplary embodiment, when the plurality of transport speed modes including the case where the transport speed S is 1 inch/second, the case where the transport speed S is 3 inches/second, and the case where the transport speed S is 5 inches/second exists, the reference current measurement operation is not performed for each of the plurality of transport speed modes, but the reference current measurement operation is performed only for a transport speed mode in which the transport speed S is the fastest to acquire a reference current profile B.

In the other transport speed modes, the reference current measurement operation is not performed, and the generated current profile B is generated from the reference current profile B acquired in the transport speed mode in which the transport speed S is the fastest. Because, in the other transport speed modes, the current profile B (generated current profile B) is acquired without performing the reference current measurement operation, time for performing the reference current measurement operation can be shortened, and time for acquiring the current profile B (generated current profile B) can be shortened, as compared to a case where the current profile B (generated current profile B) is acquired by performing the reference current measurement operation.

Therefore, in the control method for the recording device 10 according to the exemplary embodiment, as compared to a case where the reference current measurement operation is performed in each of the plurality of transport speed modes, the time for performing the reference current measurement operation is shortened, and the time for acquiring the current profile B is shortened. Thus, the waiting time (downtime) for the recording device 10 can be reduced. Therefore, productivity of the recording device 10 can be enhanced.

What is claimed is:

1. A recording device comprising:
a transport unit configured to transport a medium in a plurality of transport speed modes;
a driving unit configured to drive the transport unit with a plurality of speed profiles, each corresponding to one of the plurality of transport speed modes;
a current sensor configured to measure a reference current flowing in the driving unit, the reference current being a current flowing in the driving unit when the medium is transported in a loosened state; and
a control unit configured to acquire a plurality of current profiles, each corresponding to one of the speed profiles, based on the reference current, wherein:
the plurality of transport speed modes includes a first transport speed mode, and a second transport speed mode in which a transport speed of the medium is slower than that in the first transport speed mode,
the plurality of speed profiles includes a first speed profile corresponding to the first transport speed mode and a second speed profile corresponding to the second transport speed mode,
the plurality of current profiles includes a first current profile corresponding to the first speed profile and a second current profile corresponding to the second speed profile,
each of the speed profiles includes an acceleration region in which the transport speed increases over time, and
the control unit is configured to acquire the first current profile from the reference current when the medium is transported in the first transport speed mode, and is further configured to use the first current profile until a predetermined time in the acceleration region, and to generate the second current profile in the acceleration region.

2. The recording device according to claim 1, wherein:
the speed profile includes a constant speed region in which the transport speed is constant over time, and
the control unit is configured to use the first current profile in the constant speed region to generate the second current profile in the constant speed region.

3. The recording device according to claim 1, wherein:
the current sensor is configured to measure the reference current discretely.

4. A recording device comprising:
a transport unit configured to transport a medium in a plurality of transport speed modes;
a driving unit configured to drive the transport unit with a plurality of speed profiles, each corresponding to one of the plurality of transport speed modes;
a current sensor configured to measure a reference current flowing in the driving unit, the reference current being a current flowing in the driving unit when the medium is transported in a loosened state; and
a control unit configured to acquire a plurality of current profiles, each corresponding to one of the speed profiles, based on the reference current, wherein:
the plurality of transport speed modes includes a first transport speed mode, and a second transport speed mode in which a transport speed of the medium is slower than that in the first transport speed mode,
the plurality of speed profiles includes a first speed profile corresponding to the first transport speed mode and a second speed profile corresponding to the second transport speed mode,
the plurality of current profiles includes a first current profile corresponding to the first speed profile and a second current profile corresponding to the second speed profile, and
the control unit is configured to acquire the first current profile based on the reference current when the medium is transported in the first transport speed mode; and
the control unit is configured to generate the second current profile based on the first current profile.

5. A control method comprising:
providing a recording device comprising:
a transport unit configured to transport a medium in a plurality of transport speed modes,
a driving unit configured to drive the transport unit with a plurality of speed profiles, each corresponding to one of the plurality of transport speed modes,
a current sensor configured to measure a reference current flowing in the driving unit, the reference current being a current flowing in the driving unit when the medium is transported in a loosened state, and
a control unit configured to acquire a plurality of current profiles, each corresponding to one of the speed profiles, based on the reference current, wherein:
the plurality of transport speed modes includes a first transport speed mode, and a second transport speed mode in which a transport speed of the medium is slower than that in the first transport speed mode,
the plurality of speed profiles includes a first speed profile corresponding to the first transport speed mode and a second speed profile corresponding to the second transport speed mode,
the plurality of current profiles includes a first current profile corresponding to the first speed profile and a second current profile corresponding to the second speed profile;
acquiring, using the control unit, the first current profile based on the reference current when the medium is transported in the first transport speed mode; and
generating, using the control unit, the second current profile based on the first current profile.

* * * * *